(12) United States Patent
Sato et al.

(10) Patent No.: US 7,560,040 B2
(45) Date of Patent: Jul. 14, 2009

(54) ETCHING METHOD AND ARTICLE ETCHED MOLDED BY THAT METHOD

(75) Inventors: Shunsuke Sato, Kakogawa (JP); Naoki Koda, Kakogawa (JP); Shunsuke Fukutomi, Kakogawa (JP); Takashi Shirai, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 224 days.

(21) Appl. No.: 10/490,367

(22) PCT Filed: Jul. 14, 2003

(86) PCT No.: PCT/JP03/08945

§ 371 (c)(1),
(2), (4) Date: Mar. 23, 2004

(87) PCT Pub. No.: WO2004/010577

PCT Pub. Date: Jan. 29, 2004

(65) Prior Publication Data

US 2004/0248423 A1    Dec. 9, 2004

(30) Foreign Application Priority Data

Jul. 23, 2002    (JP)    ............................ 2002-213738

(51) Int. Cl.
*C03C 15/00*    (2006.01)
*C03C 25/68*    (2006.01)
*C23F 1/00*    (2006.01)

(52) U.S. Cl. ................................. 216/41; 216/2; 216/83
(58) Field of Classification Search ................. 310/370; 29/25.35; 216/83, 41
See application file for complete search history.

(56) References Cited

U.S. PATENT DOCUMENTS 4,768,751 A * 9/1988 Giachino et al. ............ 251/331
5,141,596 A * 8/1992 Hawkins et al. ................. 216/2

FOREIGN PATENT DOCUMENTS

| JP | 52-052597 | 4/1977 |
|---|---|---|
| JP | 7-297662 | 11/1995 |
| JP | 9-284074 | 10/1997 |
| JP | 2002-076806 | 3/2002 |
| JP | 2002-198772 | 7/2002 |
| JP | 2003-17976 | 1/2003 |
| JP | 2003-133895 | 5/2003 |
| JP | 2003-133896 | 5/2003 |

* cited by examiner

*Primary Examiner*—Roberts Culbert
(74) *Attorney, Agent, or Firm*—Wenderoth, Lind & Ponack, L.L.P.

(57) ABSTRACT

A tuning-fork crystal wafer 1A which has legs 11, 12 with grooves 11c, 12c is shaped by etching of a crystal substrate 2. To improve processing precision of the depth of the grooves 11c, 12c, the width of the grooves 11c, 12c is set in advance, based on the etch stop technique in which the amount of etching depends on the pattern of an etch portion. Consequently, as far as the etch time satisfies a required minimum time, it is possible to obtain the depth as designed.

6 Claims, 24 Drawing Sheets

(a)

(b)

(a)

(b)

(a)　　　　　　　(b)

(a)

(b)

ETCHING METHOD AND ARTICLE ETCHED MOLDED BY THAT METHOD

BACKGROUND OF THE INVENTION

1. Field of the Invention

This invention relates to etching methods for etching a material to be shaped (such as a crystal substrate) into a predetermined pattern, and also relates to etch products (such as a crystal wafer) shaped by these methods. In particular, this invention is concerned with measures for simplifying control operations in an etching step.

2. Description of the Related Art

Among conventional piezoelectric devices, a tuning-fork crystal transducer is easy to miniaturize. As disclosed in Japanese Patent Laid-open Publication No. H10-294631, this type of transducer is equipped with a tuning-fork crystal oscillator in which a crystal wafer is processed in the shape of a tuning fork by etching and provided with prescribed surface electrodes by photolithography.

Japanese Patent Laid-open Publication No. 2002-76806 (herein after mentioned as "Prior art document 1") discloses a tuning-fork crystal oscillator whose legs have grooves formed in the central parts of their front and back surfaces (major surfaces). The grooves formed in the front and back surfaces of the legs are effective because, even in a miniaturized oscillator, they can reduce loss of oscillations in the legs and can ensure a low CI (crystal impedance). The tuning-fork crystal transducer of this type is particularly suitable for being mounted on a precision instrument such as a watch.

Regarding this tuning-fork crystal wafer whose legs have grooves formed in their front and back surfaces, its shaping process is described according to the method disclosed in Prior art document 1.

To start with, a crystal substrate (Z-plate quartz crystal) 100 is processed into a plate as shown in FIG. 23(a). Then, using a sputtering apparatus (not shown), metal layers 101, 101 of Cr (chromium) and Au (gold) are deposited over the front and back surfaces of this crystal substrate 100 (see FIG. 23(b)). Photoresist layers 102, 102 are formed on these metal layers 101, 101 (see FIG. 23(c)).

Next, as outline patterning, the photoresist layers 102 are partially removed in such a manner that the photoresist layers 102, 102 remain on oscillator-shape areas 103 which correspond to the pattern of an intended tuning-fork crystal wafer (the shape of a tuning fork) and on frames 104, 104 which define the outer border of the crystal substrate 100. FIG. 23(d) and FIG. 24(a) are a sectional view and a perspective view showing this stage, respectively. As illustrated in FIG. 24(a), the photoresist layers 102, 102 constitute reliefs of a tuning-fork crystal wafer in a prescribed pattern.

Moving next to FIG. 23(e), the metal layers 101 are etched away in a Au etchant and a Cr etchant, from the parts where the photoresist layers 102 were removed in FIG. 23(d). Thereby, as shown in FIG. 24(b), the crystal substrate 100 is exposed at the parts where the metal layers 101 were etched away.

Turning then to FIG. 23(f), the photoresist layers 102 which were retained in FIG. 23(e) are removed completely. After that, the crystal substrate 100 is entirely covered with photoresist layers 105 as shown in FIG. 23(g).

Further, the photoresist layers 105 are partially removed as shown in FIG. 23(h). To be specific, the photoresist layers 105 are removed except on the oscillator-shape areas 103 and the frames 104. In addition, as groove patterning, the photoresist layers 105 are removed from the parts to be grooves 106 (see FIG. 23(k)).

Thereafter, as shown in FIG. 23(i), outline etching is performed with use of a crystal etchant, whereby only the oscillator-shape areas 103 and the frames 104 are retained.

Further, as shown in FIG. 23(j), the metal layers 101 are etched away in the Au etchant and the Cr etchant, from the parts to be the grooves 106 in the legs of the tuning-fork crystal wafer.

The resulting crystal substrate 100 is immersed in the crystal etchant for a preset period of time, until the crystal substrate 100 is etched to a predetermined depth. Thereby, the legs acquire grooves 106, 106, . . . in their front and back surfaces, and a generally H-shape cross-section. Finally, as shown in FIG. 23(k), the remaining photoresist layers 105 and the metal layers 101 are removed to produce a tuning-fork crystal wafer whose legs have a generally H-shape cross-section.

In the thus obtained tuning-fork crystal wafer, certain electrodes are provided on each surface of oscillation areas to make a tuning-fork crystal oscillator. In turn, this tuning-fork crystal oscillator is mounted inside a package to give a crystal transducer.

In connection with the tuning-fork crystal wafer whose legs have grooves 106, 106, . . . in their front and back surfaces, the grooves 106 should be processed with an extremely high precision for the following reasons.

Firstly, in the tuning-fork crystal transducer having the grooves 106, the oscillation frequency tends to be more variable than in the one without grooves 106. An effective means to reduce this tendency is to process the grooves 106 with a high precision.

Secondly, the tuning-fork crystal transducer having the grooves 106 ensures a low crystal impedence (CI). In order to ensure a low CI effectively, the grooves 106 need to be processed with a high precision.

Additionally, although the above description is focused on the outline processing and groove processing for a tuning-fork crystal wafer, high-precision processing is similarly preferable for other crystal wafers (e.g. an AT-cut crystal wafer).

Nevertheless, the method disclosed in Prior art document 1 has some problems as below.

In the etching step of forming grooves 106, 106, . . . in the front and back surfaces of the legs (the step of immersing the item shown in FIG. 23(j) into the crystal etchant), the crystal substrate 100 is etched deeper as the time passes.

Hence, in order to process the grooves 106 to an optimum depth as designed, the time for immersing the crystal substrate 100 in the crystal etchant (the etch time) has to be under strict management. Namely, if the etch time is too short, the grooves 106 are not deep enough. On the other hand, if the etch time is too long, the grooves 106 become too deep. In some cases, the grooves 106, 106 in the front and back surfaces may even penetrate into each other to form through-holes in the legs. Owing to this requirement, the method disclosed in Prior art document 1 involves complicated management of the etch time, which deteriorates workability.

Where better productivity is particularly intended, a crystal etchant which effects a great amount of etching per unit time may be employed to finish formation of the grooves 106, 106, . . . in a short time. In this case, however, slightest deviation from the optimum etch time causes the depth of the grooves 106 to deviate significantly from the design depth, ending with a deficient crystal wafer. Thus, for the method disclosed in Prior art document 1, it is difficult to enhance productivity and yield of the crystal wafer at the same time.

Generally speaking, the CI can be decreased in a tuning-fork crystal wafer of a relatively large size. In this type of crystal wafer, grooves are etched in the front and back surfaces of its legs, with the bottom of each groove having a relatively large area. In this connection, it should be kept in mind that a crystal wafer generally contains pits which are generated at a plurality of locations during the crystal growth process. These pits do not dissolve in a crystal etchant.

Hence, in the above-mentioned structure where the bottoms of the grooves have large areas, it is highly probable that many pits are exposed at the bottoms in the course of etching. If many pits are exposed at the bottoms of the grooves, the mass of the crystal wafer exceeds a target mass by the total volume of the exposed parts of the pits. Under such circumstances, the oscillation frequency of a crystal transducer cannot be tuned to a target frequency. Since the locations and the number of pits are unpredictable, it is difficult to reduce the number of exposed pits by simply adjusting the amount of etching (the etch time). Thus, according to the method disclosed in Prior art document 1, a crystal transducer cannot acquire a desired oscillation frequency at a high probability.

This invention is made in the light of these matters, and aims to provide an etching method for processing a material to be shaped (such as a crystal substrate). This etching method intends to dispense with the etch time management so as to simplify control operations in an etching step. Besides, when grooves are etched in a crystal substrate (a material to be shaped), this etching method intends to reduce exposure of pits at the bottoms of these grooves.

SUMMARY OF THE INVENTION

In order to achieve the above object, a solution according to this invention intends to improve processing precision of an etch product by utilizing what is known as "etch stop technique". The etch stop technique means the amount of etching depends on a portion to be etched in an etching treatment, wherein the pattern of the etch portion is set in advance.

Specifically, this invention is directed to an etching method for etching a prescribed etch portion which is set on a surface of a material to be shaped. During an etching treatment for the etch portion, etching comes to a stop at an etch stop position which depends on a pattern of the etch portion. With respect to this etching method, the pattern of the etch portion is set in advance such that an amount of etching on occurrence of an etch stop is substantially equal to a design amount of etching which is also set in advance.

If the etch portion is rectangular, a width of shorter sides in the etch portion is set in advance such that during the etching treatment, the amount of etching at the etch stop position is substantially equal to the design amount of etching.

Owing to these features, it is not necessary to strictly manage how long the material to be shaped should be immersed in the etchant (the etch time). As far as the etch time satisfies a required minimum time, it is possible to obtain a proper amount of etching and to etch the etch portion into the design pattern. In other words, as far as the pattern of the etch portion is appropriately set in advance, a proper amount of etching is ensured even if the etch time is too long. Accordingly, the etch portion can be processed with a high precision. Besides, omission of a strict etch time management can simplify control operations.

Furthermore, the etched surface obtained by the etch stop technique reveals a crystal surface. Because pits (mentioned above) do not inherently appear on a crystal surface, exposure of pits can be avoided on the etched surface in the etch portion. Hence, a pit-free etch portion of a predetermined pattern can be provided on the surface of the material to be shaped. When this technique is applied to etching of a crystal transducer, the mass of a crystal wafer can meet a target mass, and the oscillation frequency of the crystal transducer can be tuned to a target frequency.

Where the above methods are adopted, an etch pattern can be optionally set in the following manner. With respect to an etch portion on a surface of a material to be shaped, etching of the etching portion involves: an outer periphery etching step of etching only at least a part of an outer periphery of the etch portion; and a center etching step of etching the etch portion other than the part etched in the outer periphery etching step, the center etching step being started later than the outer periphery etching step (equivalent to the methods of Examples 3 to 7 which will be described later with reference to FIG. 6 to FIG. 17). In conducting these etching steps, the above etching methods (namely, the pattern of the etch portion is set in advance such that the amount of etching is substantially equal to a design amount of etching) are utilized in the outer periphery etching step of etching only at least a part of the outer periphery of the etch portion.

Owing to this feature, a part of the etch portion (at least a part of the outer periphery of the etch portion) is pre-etched in a given amount during the preceeding outer periphery etching step. As for the amount of etching, the pattern of the etch portion targeted in the outer periphery etching step is set in advance, whereby a corresponding etch stop action realizes a proper amount of etching. Later, during the center etching step, the etch portion is etched entirely to complete the etch process. In summary, the outer periphery etching step concerns pre-etching of a relatively small area in a proper amount. The sub-sequent center etching step concerns etching of the entire etch portion in a given amount, which depends on the amount of etching properly obtained in the outer periphery etching step. Thus, the amount of etching in the final etch portion is set properly throughout the etch portion. Even when a relatively large area is subjected to an etch process, an etch product can be processed with an improved precision.

To give a specific example of applying this solution, a groove which has a rectangular opening may be formed in each major surface of a tuning fork-shape crystal wafer, by etching a central part of the major surface. Specifically speaking, with respect to the groove which has a rectangular opening defined by sides, the outer periphery etching step is involved in etching of only a pair of opposing sides in the opening and their vicinities, whereas the center etching step is involved in etching of a portion between the pair of sides which are etched in the outer periphery etching step.

The groove formed in each major surface of the tuning-fork crystal wafer is effective because, even in a miniaturized oscillator, it can reduce loss of oscillations in each leg and can ensure a low crystal impedence (CI). The above solution can process such a groove with a high precision, can ensure a low CI effectively, and can restrict variations of the oscillation frequency.

To form this groove in each major surface of a tuning-fork crystal wafer as described above, three specific methods can be mentioned.

With a proviso that the material to be shaped is a crystal substrate, the first method is composed of: a first shaping process for shaping the material into a tuning fork-shape crystal wafer; and a second shaping process which follows the first shaping process, for forming a groove in each major surface of the crystal wafer by performing the outer periphery etching step and the center etching step in this order (equivalent to the method of Example 3 which will be described later with reference to FIG. 6 and FIG. 7).

Also with a proviso that the material to be shaped is a crystal substrate, the second method involves performing the outer periphery etching step simultaneously with a step of shaping the material into a tuning fork-shape crystal wafer, and performing the center etching step thereafter (equivalent to the methods of Examples 4 and 5 which will be described later with reference to FIG. 8 to FIG. 11).

The third method involves the steps of: providing, in advance, an etch retardant layer which only covers a surface of the etch portion to be etched in the center etching step; etching the material in the presence of the etch retardant layer; dissolving and removing the etch retardant layer after the start of the outer periphery etching step; and starting the center etching step thereafter (equivalent to the method of Example 6 which will be described later with reference to FIG. 12 and FIG. 13).

Among them, the second and third formation methods can reduce the number of etching operations for the crystal substrate, thereby protecting the crystal wafer from surface roughening and other troubles. Further, in the third formation method, the step of shaping the crystal substrate in the form of a tuning fork, the outer periphery etching step, and the center etching step may be performed all together. In this case, while a crystal substrate undergoes a single etching process, the tuning-fork crystal wafer can be shaped to a predetermined outline (a tuning-fork shape) and a groove can be formed in each major surface of the crystal wafer. Eventually, this arrangement can protect the crystal wafer from surface roughening and can simplify the shaping process.

The technical idea of this invention also encompasses an etch product shaped by any one of the etching methods according to the above solutions, wherein a crystal surface appears on an etched surface in the etch portion. Namely, if a crystal surface appears on the etched surface of an etch product, it can be judged as an etch product produced by the above production methods.

Where the above methods are adopted, an outline of a material to be shaped, and a groove may be processed by etching in the following manner. Namely, it is an etching method for shaping an etch product which has an outline and a groove as prescribed, by etching the material to be shaped. This etching method is composed of: an outline etching operation of etching away a portion of the material outside an outer periphery of an intended etch product; and a groove etching operation of etching a groove formation portion on the material and causing the portion to be depressed. In this etching method, the material to be shaped is etched in a process comprising: providing, in advance, an etch retardant layer which only covers a surface of the groove formation portion; etching the material in the presence of the etch retardant layer; dissolving the etch retardant layer after the start of and simultaneously with the outline etching operation, and starting the groove etching operation after the etch retardant layer is dissolved and removed. Further in this method, during the groove etching operation for the groove formation portion, etching comes to a stop at an etch stop position which depends on a pattern of the groove formation portion. A pattern of the etch retardant layer is set in advance such that an amount of etching on occurrence of an etch stop is substantially equal to a design groove depth which is also set in advance (equivalent to the method of Example 2 which will be described later with reference to FIG. 4).

In this respect, the etch retardant layer may be provided (its material and thickness may be selected) such that the outline etching operation is under way at the start of the groove etching operation, or such that the outline etching operation has already finished before the start of the groove etching operation.

Specifically, the etch retardant layer can be disposed on the surface of the groove formation portion in the following manner. To start with, a coating layer is provided at a portion inside the outer periphery of an intended etch product by laminating components of different etch rates, a component for an upper layer having a lower etch rate than a component for a lower layer. In this regard, the lower layer can be made of a high-etch-rate component, which dissolves more readily in an etchant, whereas the upper layer can be made of a low-etch-rate component, which does not readily dissolve in an etchant. After that, only the upper layer is removed from the groove formation portion, thereby exposing the lower layer. Lastly, the material to be shaped is etched, with utilizing the exposed lower layer as an etch retardant layer.

Owing to this feature, when the etching treatment for a material to be shaped is started, etching of the material begins immediately at a portion which is not covered with the etch retardant layer, namely, a portion outside the outer periphery of an intended etch product (the start of the outline etching operation). In contrast, etching of the material does not start at a portion which is covered with the etch retardant layer, namely, the groove formation portion. In the groove formation portion, etching causes dissolution of the etch retardant layer alone, but does not yet affect the material to be shaped.

After this condition continues for a certain period of time, the etch retardant layer on the groove formation portion is dissolved and removed completely. Then, etching of the material finally begins in the groove formation portion (the start of the groove etching operation). At this stage, the groove etching operation proceeds side by side with the outline etching operation. However, the outline etching operation may have already finished before the start of the groove etching operation.

Eventually, the groove formation portion acquires a groove of a predetermined depth. Besides, in the portion outside the outer periphery of the etch product, which is the portion where etching started earlier than the groove etching operation, the amount of etching is sufficient to give a desired outline to the etch product.

As the two components which are different in etch rate, the high-etch-rate component may be Cr, and the low-etch-rate component may be Au, to give an example. In a coating layer composed of these two layers, the portion inside the outer periphery of an intended etch product (the part to constitute the etch product) has a double-layer structure of Cr and Au, whereas the groove formation portion has a single-layer structure of Cr. As a consequence, etching of the material to be shaped is not effected in the double-layer structure part. In the meantime, the material under the single-layer structure part is etched in a given amount (to the depth of the groove) after the Cr dissolves, as the groove etching operation. Components applicable to these structures are not limited to those mentioned above.

Specific products to be shaped by these etching methods include a tuning-fork crystal wafer, in which case the groove is formed in a central part of each major surface thereof.

The groove thus formed in each major surface of a tuning-fork crystal wafer is effective because, even in miniaturizing a tuning-fork crystal oscillator which is produced with use of this tuning-fork crystal wafer, the groove can reduce loss of oscillations in each leg and can ensure a low CI.

The technical idea of this invention further encompasses an etch product shaped by any one of the etching methods according to the above solutions.

Regarding the center etching step, the groove (the etch portion) can be formed into a desired pattern in the following manners. One such manner is to terminate the center etching step, with a central part of the etch portion retaining a projection. An other manner is to terminate the center etching step, with a central part of the etch portion being a flat surface which is substantially parallel to the surface of the material to be shaped (a major surface in a crystal wafer).

In applying these manners to formation of a tuning-fork crystal wafer, suppose that the center etching step is terminated, with the central part of each groove retaining a projection. This arrangement can enlarge the surface area within the groove, thereby increasing the area of an electrode provided within the groove and ensuring a low CI effectively. As for the CI restriction effect, experiments have proved that manifestation of the effect depends on the cross-sectional thickness of the thinnest part between grooves (determined by the depth of grooves, or the amount of etching). Namely, the thinnest cross-sectional part between grooves is made as thin as possible, with the central part of each groove retaining a projection. As a result, it is possible to secure a satisfactory rigidity for a crystal wafer as well as to ensure a sufficiently low CI.

In contrast, suppose that the center etching step is terminated, with the central part of a groove being a flat surface which is substantially parallel to a major surface of a crystal wafer. In this case, the left and right legs of the tuning-fork crystal wafer can be shaped to have a generally symmetrical cross-section, and in each groove, electrode layers can be provided in a uniform thickness. Consequently, a piezoelectric device (e.g., a crystal transducer) using this crystal wafer can exhibit favorable characteristics and sophisticated functions.

Furthermore, the technical idea of this invention encompasses an etch product shaped by the above etching methods, wherein the central part of the etch portion (the central part of the groove) has a projection, or wherein the central part of the etch portion (the central part of the groove) is a flat surface which is substantially parallel to the surface of the material to be shaped (a major surface of a crystal wafer). If the groove is made by a conventional etching method, the central part of the groove is defined by a surface which is inclined to a major surface of a crystal wafer. To put it another way, if the central part of the groove has a projection or is a flat surface which is substantially parallel to a major surface, it can be judged as an etch product produced by the above production methods.

Moreover, the following arrangement can provide an etch process range having a relatively large area, while reducing exposure of pits (mentioned above). It involves the steps of: setting an etch process range on a surface of a material to be shaped; dividing an inside of the etch process range into a plurality of adjacent etch portions; and etching these etch portions by any one of the etching methods according to the above solutions.

Owing to this feature, etched surfaces in the individual etch portions are obtained by the etch stop technique and reveal crystal surfaces. Because pits (mentioned above) do not appear on these crystal surfaces, exposure of pits on the etched surfaces can be reduced throughout the etch process range which is made up of a group of etch portions. Therefore, where the etch process range is defined by a group of etch portions on a surface of a material to be shaped, it is possible to obtain an etch process range with a relatively large area, while reducing exposure of pits. In particular, if the material to be shaped is large in size, the etch process range tends to be large as well. Even then, exposure of the pits can be reduced, and the surface of the material to be shaped can be etched in a predetermined pattern. When this technique is applied to etching of a crystal transducer, the mass of a crystal wafer can meet a target mass, and the oscillation frequency of the crystal transducer can be tuned to a target frequency.

For this arrangement, the respective etch portions may have some specific patterns. As such, the respective etch portions may be set to define separate grooves in the surface of the material to be shaped. Otherwise, the respective etch portions may be set to define at least one continuous groove with each other in the surface of the material to be shaped.

Still further, the technical idea of this invention encompasses an etch product shaped by the etching method according to this solution, wherein a crystal surface appears on an etched surface in each of the etch portions which are adjacent to each other on the surface of the material to be shaped. Namely, if crystal surfaces appear on the etched surfaces of an etch product, it can be judged as an etch product produced by the above production methods.

DETAILED DESCRIPTION OF THE INVENTION

Figure 1:
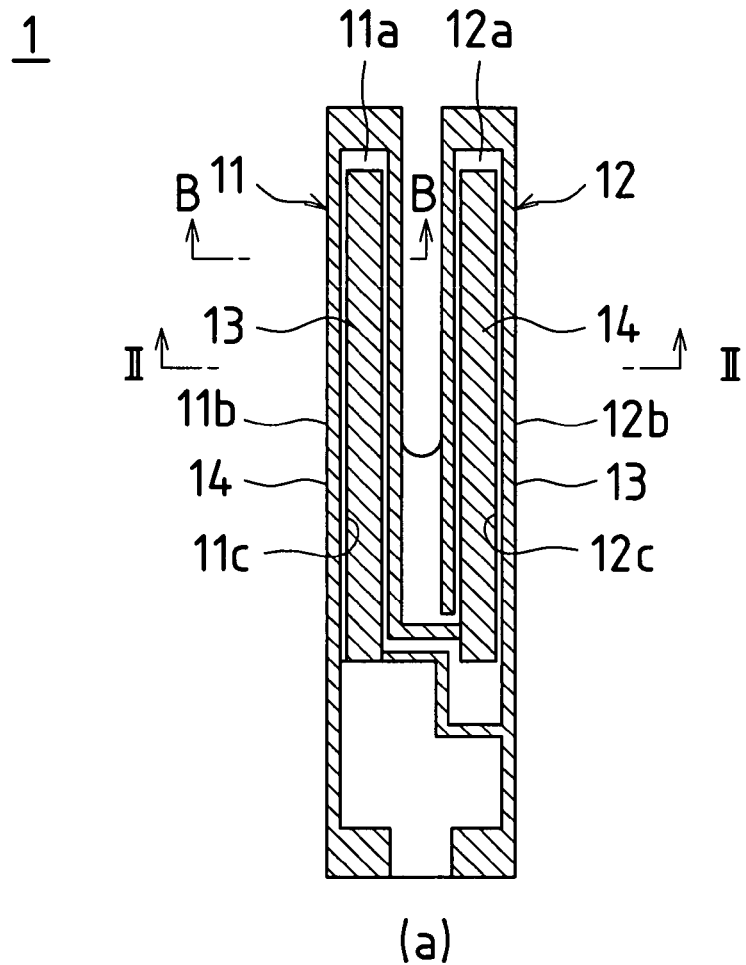
FIG. 1 shows a tuning-fork crystal oscillator according to Examples 1 and 2, (a) being a front view of the tuning-fork crystal oscillator and (b) being a cross-section taken along the line II-II in (a).
Figure 1:
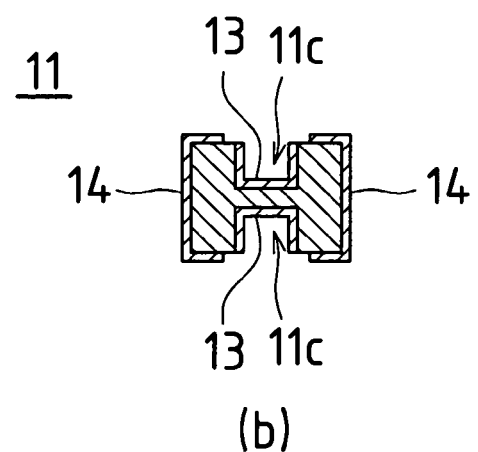

Now, embodiments of this invention are described with reference to the drawings. In the following description, the invention is applied to etching methods for shaping a tuning-fork crystal wafer which constitutes a tuning-fork crystal transducer.

EXAMPLES

Description of the Structure of a Tuning-Fork Crystal Transducer

Before the description of etching methods for shaping a tuning-fork crystal wafer, let us mention the structure of a tuning-fork crystal transducer.

FIG. 1(a) is a front view of a tuning-fork crystal oscillator 1 concerning this embodiment, to be mounted in a tuning-fork crystal transducer. FIG. 1(b) is a cross-section taken along the line B-B in FIG. 1(a).

The tuning-fork crystal oscillator 1 has two legs 11, 12, each of which is provided with first and second excitation electrodes 13, 14. In FIG. 1(a), the excitation electrodes 13, 14 are indicated by shading.

In this tuning-fork crystal oscillator 1, major surfaces 11a, 12a (front and back surfaces) of the legs 11, 12 contain rectangular grooves 11c, 12c in central parts thereof. Etching steps for processing these grooves 11c, 12c will be detailed later.

The grooves 11c, 12c formed in the front and back surfaces of the legs 11, 12 are effective because, even in a miniaturized tuning-fork crystal oscillator 1, these grooves can reduce loss of oscillations in the legs 11, 12 and can ensure a low crystal impedance (CI).

The first excitation electrodes 13 locate inside the grooves 11c which are formed in the front and back surfaces (major surfaces) 11a of the first leg 11, and also locate on side surfaces 12b of the second leg 12. The electrodes inside the grooves and those on the side surfaces are connected together. Similarly, the second excitation electrodes 14 are located inside the grooves 12c which are formed in the front and back surfaces (major surfaces) 12a of the second leg 12, and also locate on side surfaces 11b of the first leg 11. The electrodes inside the grooves and those on the side surfaces are connected together. These excitation electrodes 13, 14 are thin layers (e.g., in a thickness of 2000 Å) made by metal deposition of chromium (Cr) and gold (Au).

Although not shown, a tuning-fork crystal transducer is manufactured by mounting this tuning-fork crystal oscillator 1 on a base and attaching a cap along the outer circumference of the base so as to cover the tuning-fork crystal oscillator 1.

Description of Etching Steps for a Tuning-Fork Crystal Wafer

Next, etching methods for shaping a tuning-fork crystal wafer are described by way of several examples.

Example 1

Figure 2:
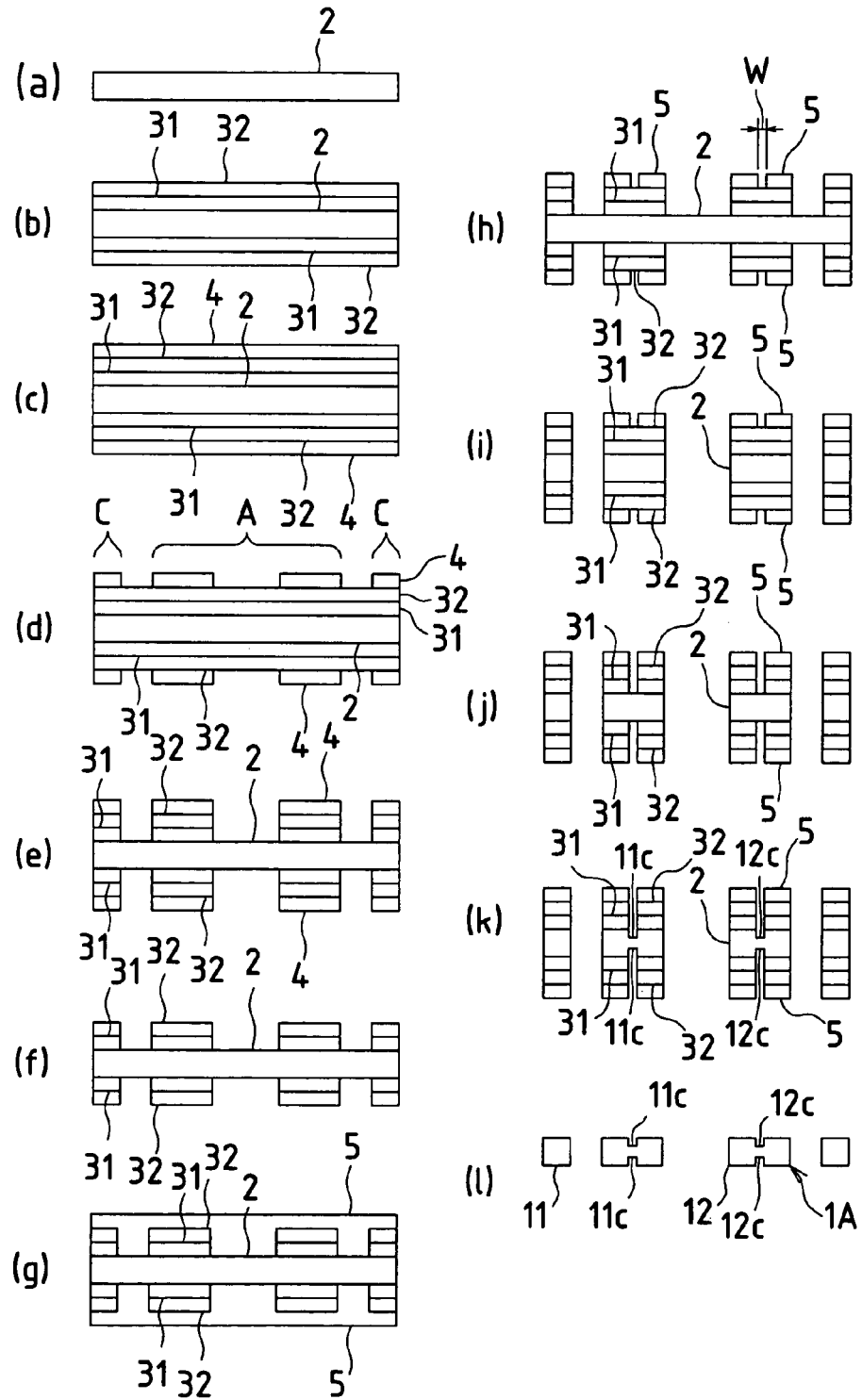
FIG. 2 shows a shaping process of a tuning-fork crystal wafer according to Example 1.

Example 1 is described with reference to FIG. 2 and FIG. 3. A method for shaping a tuning-fork crystal wafer according to this embodiment involves a first shaping process and a second shaping process which follows the first shaping process. The first shaping process is to shape a crystal substrate (a material to be shaped) into a predetermined pattern (a tuning-fork shape) except the grooves 11c, 12c. The second shaping process is to form the grooves 11c, 12c.

<First Shaping Process>

To start with, the first shaping process is described with reference to FIG. 2, which illustrates a series of processing states by cross-sections taken along the line II-II in FIG. 1.

The first shaping process begins by processing a crystal substrate 2 into a plate, as shown in FIG. 2(a). During this process, the front and back surfaces of the crystal substrate 2 are polished to a mirror finish.

Then, using a sputtering apparatus (not shown), Cr layers 31 are deposited over the front and back surfaces of the crystal substrate 2, and Au layers 32 are deposited over the surfaces of the Cr layers 31 (see FIG. 2(b)). Photoresist layers 4 are formed on these metal layers 31, 32 (see FIG. 2(c)).

Thereafter, outline patterning is performed as illustrated in FIG. 2(d). The photoresist layers 4 are partially removed in such a manner that the photoresist layers 4 remain on oscillator-shape areas A which correspond to the pattern of an intended tuning-fork crystal wafer (the shape of a tuning fork) and on frames C which define the outer border of the crystal substrate 2.

Moving next to FIG. 2(e), the metal layers 31, 32 are etched away in a Au etchant and a Cr etchant, from the parts where the photoresist layers 4 were removed in FIG. 2(d). Thereby, the crystal substrate 2 is exposed at the parts where the metal layers 31, 32 were etched away.

Turning then to FIG. 2(f), the photoresist layers 4 which were retained in FIG. 2(e) are removed completely.

After that, the front and back surfaces of the crystal substrate 2 are entirely covered with photoresist layers 5 as shown in FIG. 2(g).

Further, the photoresist layers 5 are partially removed as shown in the FIG. 2(h). To be specific, the photoresist layers 5 are removed except on the oscillator-shape areas A and the frames C. In addition, as groove patterning, the photoresist layers 5 are removed from the parts to be grooves 11c, 12c (see FIG. 2(l)).

With respect to the groove patterning, the removal width of the photoresist layers 5 (i.e. width W in FIG. 2(h)) corresponds to the width of shorter sides of etch portions as defined in this invention. As a characteristic of the present invention, this removal width is determined in accordance with the depth (the design depth) of the intended grooves 11c, 12c. The issue about the removal width W of the photoresist layers 5 will be described later in detail.

Referring to FIG. 2(i), outline etching is performed with use of a crystal etchant (such as a mixed solution of hydrofluoric acid and ammonium fluoride), whereby only the oscillator-shape areas A and the frames C are retained.

The first shaping process ends with this operation. As a result of the first shaping process, the crystal substrate 2 is transformed into a tuning-fork crystal wafer which has the shape of a tuning fork (i.e. two legs 11, 12). However, the grooves 11c, 12c are not formed yet.

<Second Shaping Process>

The description proceeds to the second shaping process for forming the grooves 11c, 12c. Starting from FIG. 2(j), the metal layers 31, 32 are etched away in the Au etchant and the Cr etchant, from the parts to be the grooves 11c, 12c as intended. In other words, the metal layers 31, 32 are etched away from the portions which correspond to the removal width W of the photoresist layers 5.

Then, as shown in FIG. 2(k), the crystal substrate 2 is etched in the crystal etchant so as to form grooves 11c, 11c, 12c, 12c in the front and back surfaces of the legs. Hence, each of the legs acquires a generally H-shape cross-section.

At this stage, the portions subjected to the etching treatment are small in area (an area on the crystal substrate 2, in which the width is equal to the width of the grooves 11c, 12c), so that the amount of etching in the crystal substrate 2 is regulated by an etch stop action. Namely, when the substrate is etched to a certain degree, a crystal surface appears on each etched surface. Such a substrate is not etched any further, no matter how long it is kept immersed in the crystal etchant. Specifically, in the case of the groove patterning depicted in FIG. 2(h), the removal width W of the photoresist layers 5 is set in advance according to the design depth of the grooves 11c, 12c. This arrangement enables the grooves 11c, 12c to have a desired depth (the design depth) on occurrence of an etch stop.

Figure 3:
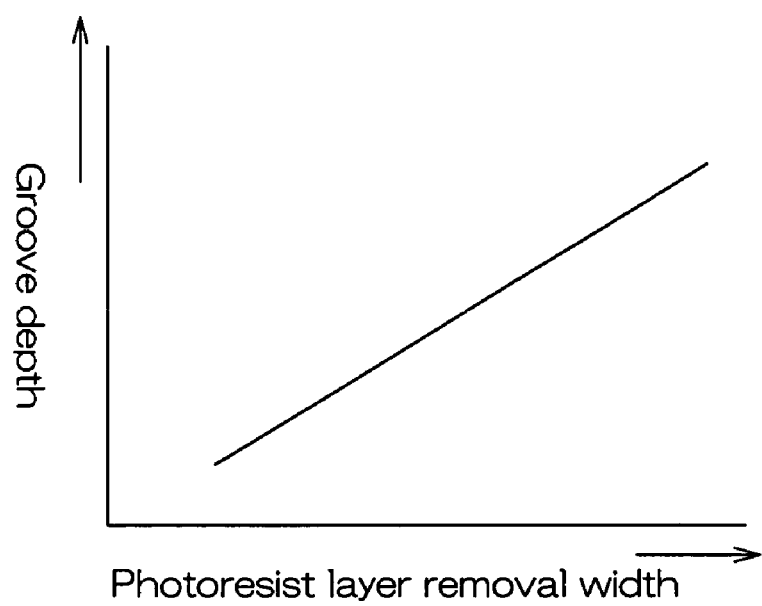
FIG. 3, which concerns groove patterning, represents how the removal width of photoresist layers is related to the groove depth on occurrence of an etch stop.

FIG. 3, which concerns this groove patterning, represents how the removal width W of the photoresist layers 5 is related to the depth of the grooves 11c, 12c on occurrence of an etch stop. As understood from this drawing, if the removal width W of the photoresist layers 5 is set greater, the depth of the grooves 11c, 12c becomes greater. In other words, the wider the grooves 11c, 12c are (The groove width is equal to the removal width W.), the deeper they are. Conversely, if the removal width W of the photoresist layers 5 is set smaller, the depth of the grooves 11c, 12c becomes smaller. In other words, the narrower the grooves 11c, 12c are, the shallower they are. As noted above, there is a correlation between the removal width and the depth of the grooves 11c, 12c. Hence, where the removal width W is set in advance according to the design depth of the intended grooves 11c, 12c, the depth of the grooves 11c, 12c can be set as desired.

In FIG. 2(k), the grooves 11c, 11c, 12c, 12c are formed in the front and back surfaces of the legs. Finally, the remaining photoresist layers 5 and the metal layers 31, 32 are removed to give a tuning-fork crystal wafer 1A whose legs have a generally H-shape cross-section as shown in FIG. 2(l).

Incidentally, in the state shown in FIG. 2(k), it is not essential to remove the metal layers 31, 32 which remain on the crystal wafer 1A. These layers may be retained as a part of a wiring pattern for a subsequent electrode forming step. Alternatively, they may be retained as a weight electrode to be partly removed for adjustment of the frequency of a tuning-fork crystal transducer (e.g., mealing for frequency adjustment).

In the thus obtained tuning-fork crystal wafer 1A, the first and second excitation electrodes 13, 14 are provided on the legs 11, 12 to give a tuning-fork crystal oscillator 1. In turn, a tuning-fork crystal transducer is manufactured by mounting this tuning-fork crystal oscillator on a base and attaching a cap along the outer circumference of the base. The resonant frequency of such a tuning-fork crystal transducer may be 20 kHz, 32 kHz, 40 kHz, 60 kHz, 75 kHz, 77.5 kHz, to name a few. However, a tuning-fork crystal transducer can be also produced at other frequencies. Additionally, this tuning-fork crystal transducer may be made as a surface-mount type or the like.

In the above-described embodiment, the second shaping process is arranged to apply the etch stop technique to the etching treatment in order to effect a proper amount of etching. As a result of this arrangement, the depth of the grooves 11c, 12c formed in the tuning-fork crystal wafer 1A can be set to an optimum depth as designed. In other words, the period for immersing the crystal substrate 2 in a crystal etchant (the etch time) does not have to be under strict management. Hence, if the etch time satisfies a required minimum time, the grooves 11c, 12c can be formed in a proper depth. Namely, as far as the removal width W of the photoresist layers 5 is set properly for the groove patterning, the grooves 11c, 12c are obtain able in a proper depth even when the etch time is too long. Thus, the grooves 11c, 12c can be processed with a high precision. Consequently, it is possible to ensure a low CI effectively and to restrict variations of the oscillation frequency. Besides, omission of the etch time management can simplify control operations.

Where better productivity is intended, a crystal etchant which effects a great amount of etching per unit time may be used to finish formation of the grooves 11c, 12c in a short time. Even in this case, the depth of the grooves 11c, 12c does not deviate from the design depth. Thus, it is possible to enhance productivity and yield of the tuning-fork crystal wafer 1A at the same time.

Further, as mentioned above, each of the etched surfaces obtained by the etch stop technique reveals a crystal surface. Because pits (mentioned above) do not appear on this crystal surface, exposure of pits can be avoided on the grooves 11c, 12c. Hence, the grooves 11c, 12c of a predetermined pattern (with no pits exposed) can be provided in the legs 11, 12 of the tuning-fork crystal oscillator 1. Eventually, the mass of a crystal wafer can meet a target mass after etching, and the oscillation frequency of a crystal transducer can be tuned to a target frequency.

Example 2

Figure 4:
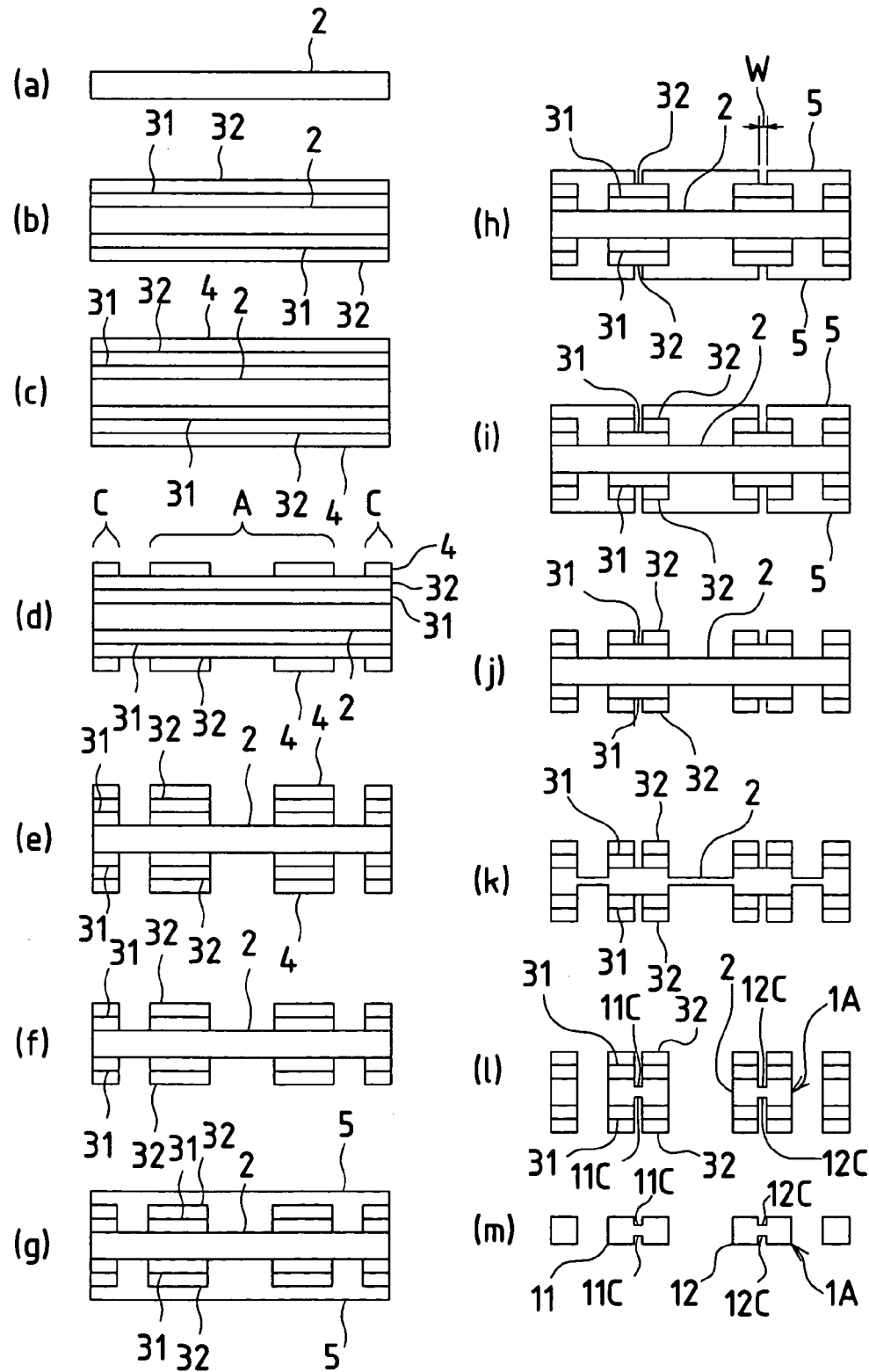
FIG. 4 shows a shaping process of a tuning-fork crystal wafer according to Example 2.

Now the description moves to Example 2. In the shaping method of a tuning-fork crystal oscillator 1 according to this embodiment, the crystal substrate 2 is subjected to formation of the grooves 11c, 12c at the same time with outline shaping of the tuning-fork crystal wafer to a predetermined pattern. This shaping process is herein after described with reference to FIG. 4.

The steps in FIGS. 4(a)-(g) are identical to those in FIGS. 2(a)-(g) for Example 1 as above, and explanation of these steps is omitted here.

Subsequent to the step in FIG. 4(g), the photoresist layers 5 are partially removed as illustrated in FIG. 4(h). To be specific, as groove patterning, the photoresist layers 5 are removed from the parts to be grooves 11c, 12c as intended.

Also in Example 2, the removal width W of the photoresist layers 5 to be removed by the groove patterning is determined in advance according to the depth (the design depth) of the intended grooves 11c, 12c.

Turning next to FIG. 4(i), only the Au layers 32 are etched away in the Au etchant from the parts where the photoresist layers 5 were removed in FIG. 4(h). Now, as the metal layers, it is only the Cr layers 31 that cover the parts to be the grooves 11c, 12c.

Thereafter, as shown in FIG. 4(j), the photoresist layers 5 which were not removed in FIG. 4(i) are removed completely. Consequently, the parts to be the grooves 11c, 12c are covered with the Cr layers 31 alone which serve as etch retardant layers, whereas the parts not to be the grooves 11c, 12c are covered with two metal layers, the Cr layers 31 and the Au layers 32.

It should be noted that Cr shows a higher etch rate than Au. Namely, Cr dissolves readily in the etchant (in this embodiment, a mixed solution of hydrofluoric acid and ammonium fluoride). In contrast, Au hardly dissolves in the etchant.

Further, outline etching is effected with use of the crystal etchant, in which the crystal substrate 2 is etched at the exposed parts which are not covered with the metal layers 31, 32. At this stage, since the metal layers which cover the parts to be the grooves 11c, 12c are composed of the Cr layers 31 alone, such Cr layers 31 are also etched (dissolved and removed) in the crystal etchant. FIG. 4(k) shows the outline etching step in progress, with the Cr layers 31 which cover the parts to be the grooves 11c, 12c being removed completely. In this state, the outline etching step is not yet finished, because part of the crystal substrate 2 remains as a thin plate.

When the etching in the crystal etchant advances beyond this state, etching of the crystal substrate 2 finally starts at the parts to be the grooves 11c, 12c where the Cr layers 31 were etched away completely. At this moment, the crystal wafer outline etching step and the groove etching step proceed side by side.

While these etching steps continue, the outline of the crystal wafer 1A turns into a pre-determined tuning-fork shape, and in due course, the etching at the parts to be the grooves 11c, 12c comes to a stop due to an etch stop action. In this state, the crystal wafer 1A will not be transformed any more, no matter how long it is kept immersed in the crystal etchant. Namely, as far as the removal width W of the photoresist layers 5 is set properly for the groove patterning shown in FIG. 4(h), the grooves 11c, 12c are obtain able in a proper depth even when the etch time is too long. Thus, the grooves 11c, 12c can be processed with a high precision.

Eventually, as shown in FIG. 4(l), the grooves 11c, 12c are formed in the design depth in the front and back surfaces of the legs, which have a generally H-shape cross-section. In this manner, the crystal wafer 1A acquires not only a predetermined outline but also the grooves 11c, 12c formed in the major surfaces. From this crystal wafer, the remaining metal layers 31, 32 are etched away in the Au etchant and the Cr etchant. Thus finished is a tuning-fork crystal wafer 1A whose legs have a generally H-shape cross-section, as shown in FIG. 4(m).

Similar to the previous embodiment, it is not essential to remove the metal layers 31, 32 which remain on the crystal wafer 1A of FIG. 4(l). These layers may be retained as a part of a wiring pattern for a subsequent electrode forming step. Alternatively, they may be retained as a weight electrode to be partly removed for adjustment of the frequency of a tuning-fork crystal transducer.

As described above, this embodiment can exhibit not only the effects achieved in Example 1 but also an additional effect. Specifically, while the crystal substrate 2 goes through only one etching process, the outline of a tuning-fork crystal wafer 1A can be transformed into a predetermined tuning-fork shape, and the grooves 11c, 12c can be formed in its major surfaces. Since the crystal substrate 2 undergoes not more than one etching operation, complex processing operations and a lengthy process time can both be avoided. It is further possible to protect the crystal wafer 1A from surface roughening and other troubles, and hence to produce a high-quality product.

Example 3

Figure 5:
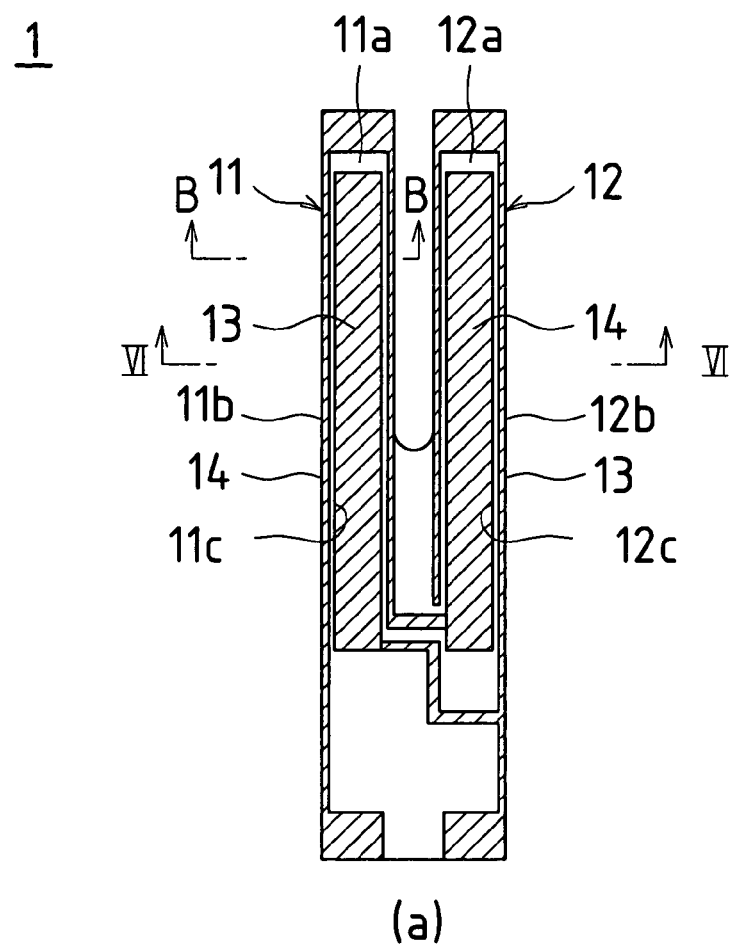
FIG. 5 shows a tuning-fork crystal oscillator according to Examples 3 to 6, (a) being a front view of the tuning-fork crystal oscillator and (b) being a cross-section taken along the line VI-VI in (a).
Figure 5:
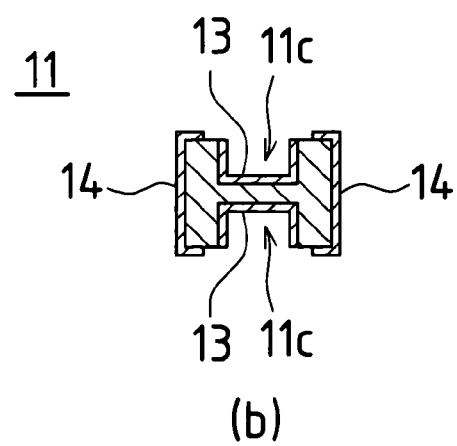

Now the description moves to Example 3. As mentioned already, the depth of the grooves 11c, 12c depends on their design width. Hence, the methods of Examples 1 and 2 cannot increase only the width of the grooves 11c, 12c without undue increase of their depth. The method of Example 3 realizes this demand. Namely, based on the etch stop technique, Example 3 realizes grooves 11c, 12c as illustrated in FIG. 5 (a drawing equivalent to FIG. 1) which have a greater width than, but the same depth as, those obtained in the previous Examples.

A method for shaping a tuning-fork crystal wafer according to Example 3 also involves a first shaping process and a second shaping process which follows the first shaping process. The first shaping process is to shape a crystal substrate (a material to be shaped) into a predetermined pattern (a tuning-fork shape) except the grooves 11c, 12c. The second shaping process is to form the grooves 11c, 12c.

<First Shaping Process>

Figure 6:
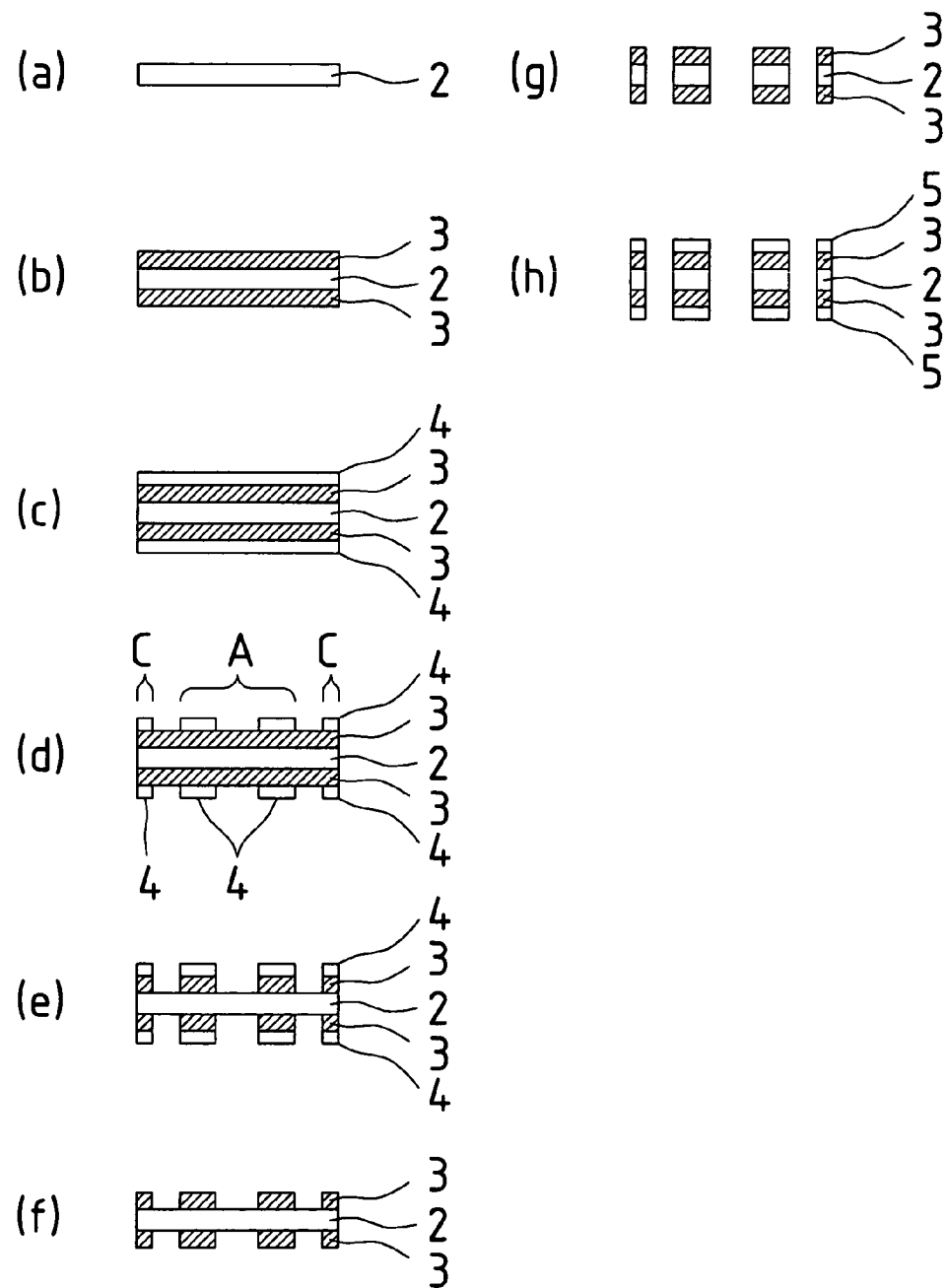
FIG. 6 shows a first shaping process concerning a method for shaping a tuning-fork crystal wafer according to Example 3.

To start with, the first shaping process is described with reference to FIG. 6, which illustrates a series of processing states by cross-sections taken along the line VI-VI in FIG. 5.

In the first shaping process, the steps in FIGS. 6(a)-(f) are identical to those in FIGS. 2(a)-(f) for Example 1 as above, and explanation of these steps is omitted here. However, it should be understood that the drawings for this and subsequent Examples illustrate a Cr layer and a Au layer as a single metal layer 3.

After the photoresist layers 4 are completely removed as shown in FIG. 6(f), outline etching is performed with use of the crystal etchant as shown in FIG. 6(g), whereby only the oscillator-shape areas A and the frames C are retained.

Thereafter, the oscillator-shape areas A and the frames C are covered with photoresist layers 5, as illustrated in FIG. 6(h).

The first shaping process ends with this operation. As a result of the first shaping process, the crystal substrate 2 is transformed into a tuning-fork crystal wafer which has the shape of a tuning fork (i.e., two legs 11, 12). However, the grooves 11c, 12c are not formed yet.

<Second Shaping Process>

Figure 7:
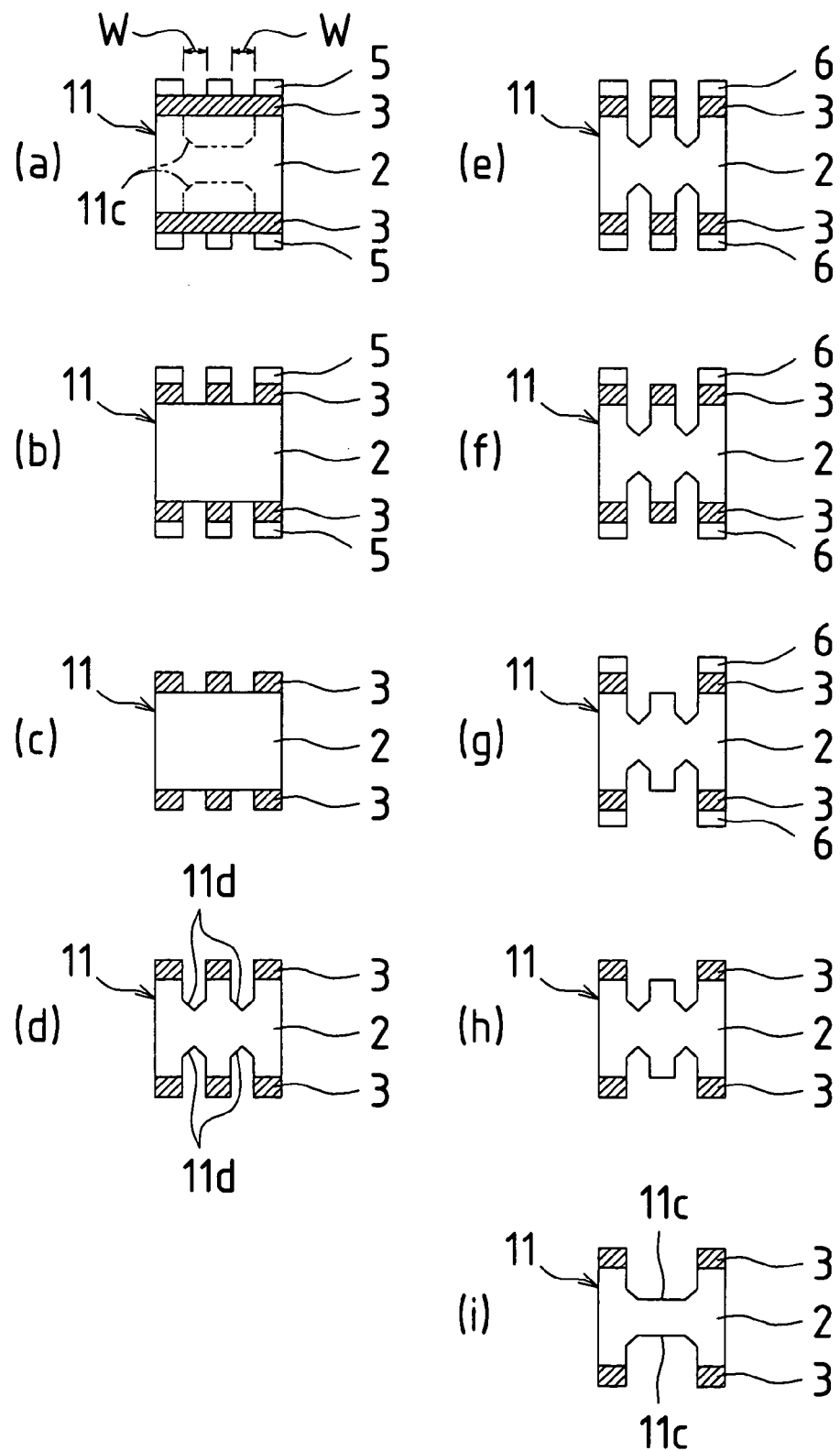
FIG. 7 shows a second shaping process concerning a method for shaping a tuning-fork crystal wafer according to Example 3.

Referring next to FIG. 7, the description proceeds to the second shaping process for forming the grooves 11c, 12c. Although FIG. 7 focuses on the first leg 11 alone, the second leg 12 is simultaneously processed in the same manner.

As illustrated in FIG. 7(a), the second shaping process starts with partial removal of the photoresist layers 5. Specifically, as groove side patterning, the photoresist layers 5 are removed from the parts to be the grooves 11c, but only along both sides of each groove 11c, namely, along the left and right lateral borders of each groove 11c in FIG. 7(a). In detail, this embodiment intends to form grooves 11c as indicated by phantom lines in FIG. 7(a). By this groove side patterning, the photoresist layers 5 are removed only along the left and right lateral borders of the contour drawn by the phantom lines. As a result, the parts to be the leg 11 retain the photoresist layers 5 in three sections each (the central, left and right sections, as illustrated in FIG. 7(a)). Similar to the previous Examples, the removal width W of the photoresist layers 5 is determined in advance according to the depth (the design depth) of the intended grooves 11c, 12c.

Moving next to FIG. 7(b), the metal layers 3 are etched away in the Au etchant and the Cr etchant, from the parts to be the grooves 11c. Namely, the metal layers 3 are etched away only from the parts where the photoresist layers 5 were removed by the groove side patterning.

Then, after the photoresist layers 5 are removed as shown in FIG. 7(c), the crystal substrate 2 is etched in the crystal etchant as shown in FIG. 7(d). As a result, the substrate is etched only along both sides of each groove 11c to give side grooves 11d, 11d.

At this stage, the portions subjected to the etching treatment are small in area (an area on the crystal substrate 2, in which the width corresponds to the removal width W), so that the amount of etching in the crystal substrate 2 is regulated by an etch stop action. Namely, when the substrate is etched to a certain degree, a crystal surface appears on each etched surface. Such a substrate is not etched any further, no matter how long it is kept immersed in the crystal etchant. Specifically, in the case of the groove side patterning depicted in FIG. 7(a), the removal width W of the photoresist layers 5 is set in advance according to the design width of the grooves 11c. This arrangement enables the side grooves 11d to have a desired depth on occurrence of an etch stop. Just as noted above, the groove side patterning also shows a correlation between the removal width W of the photoresist layers 5 and the depth of the side grooves 11d. Hence, where the removal width W is set in advance according to the design depth of the intended grooves 11c, the depth of the side grooves 11d can be set as desired. To give some specific examples, when the removal width W is 28 μm, the side grooves 11d have a depth of 23 μm each. When the removal width W is 45 μm, the side grooves 11d have a depth of 36 μm each. It should be noted that these values may change with the type of crystal etchant and other conditions. Description of the outer periphery etching step ends with this remark.

Moving next to FIG. 7(e), the surfaces of the metal layers 3 are covered with photoresist layers 6. As illustrated in FIG. 7(f), only central strips of the photoresist layers 6 are removed to expose the metal layers 3. Then, as shown in FIG. 7(g), only the exposed parts of the metal layers 3 are etched away in the Au etchant and the Cr etchant.

Further, after the photoresist layers 6 are removed as shown in FIG. 7(h), the crystal substrate 2 is etched in the crystal etchant as in FIG. 7(i). Thus, the parts of the crystal substrate 2 which stand between pairs of the side grooves 11d, 11d are subjected to etching. In other words, strips of crystal which stand at the central parts of the intended grooves 11c are etched away, whereby the grooves 11c are obtained in a predetermined shape and the leg 11 acquires a generally H-shape cross-section. Regardless of the etch time, the depth of the thus finished grooves 11c is substantially equal to the depth of the side grooves 11d made in FIG. 7(d). To put it differently, the depth of the finished grooves 11c is determined at the stage of FIG. 7(d). Description of the center etching step in this invention ends with this remark.

After the leg 11 is shaped to have a generally H-shape cross-section, the remaining metal layers 3 are removed to finish a tuning-fork crystal wafer.

As described above, the second shaping process of this embodiment involves: the outer periphery etching step of effecting a proper amount of pre-etching in a relatively small portion, based on the etch stop technique; and the center etching step of etching the remaining etch portions. In the center etching step, the entire etch portions are etched in a given amount in accordance with the amount of etching which is properly obtained in the outer periphery etching step. Therefore, the amount of etching in the final etch portions is set properly throughout the etch portions, and the grooves 11c, 12c can be formed in the crystal wafer with an improved processing precision. Consequently, it is possible to ensure a low CI effectively and to restrict variations of the oscillation frequency. Further, in both of the outer periphery etching step and the center etching step, utilization of the etch stop technique can realize a high processing precision without etch time management, and can simplify control operations. In addition, since this embodiment enables increase of the width of the grooves 11c, 12c only without undue increase of their depth, the grooves 11c, 12c can be designed with a greater freedom. The grooves 11c, 12c obtained in Example 3 are wider than the grooves 11c, 12c obtained by the methods of Examples 1 and 2.

Figure 18:
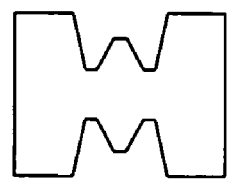
FIG. 18(a) depicts a cross-sectional leg shape of a typical crystal wafer shaped by the method according to this invention.
FIG. 18(b) is a cross-sectional leg shape of a crystal wafer shaped by a conventional method.
Figure 18:
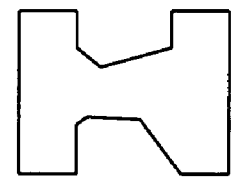

From another point of view, the conventional etching method etches the entire grooves at once, in which case the bottoms of such grooves are inclined relative to the major surfaces 11a, 12a of the crystal wafer (e.g., the shape depicted in FIG. 18(b)). In contrast, this embodiment involves the outer periphery etching step in which projections of crystal are retained at the central parts of the grooves 11c, 12c (e.g., the shape depicted in FIG. 18(a)), and the subsequent center etching step of etching these crystal projections. As a result, the central parts of the grooves 11c, 12c are made as flat surfaces which are substantially parallel to the major surfaces 11a, 12a of the crystal wafer. Therefore, this embodiment can impart a generally symmetrical cross-section to the left and right legs 11, 12 of the tuning-fork crystal wafer, and can equalize their oscillation characteristics. Further, inside the grooves 11c, 12c, the excitation electrodes 13, 14 can be provided in a uniform thickness. Consequently, a crystal transducer using this crystal wafer can exhibit favorable characteristics and sophisticated functions.

Example 4

Figure 8:
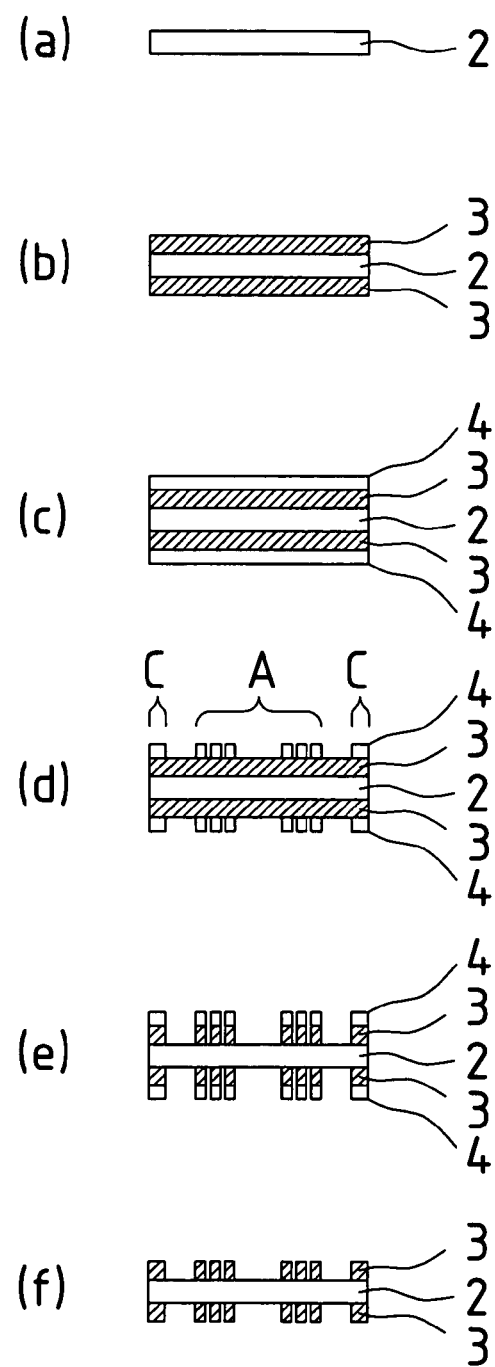
FIG. 8 shows a first half of a process for shaping a tuning-fork crystal wafer according to Example 4.

Now the description moves to Example 4. Concerning the manner of forming the grooves 11c, 12c, the shaping method of a tuning-fork crystal oscillator 1 according to this embodiment is similar to Example 3 above in that the center etching step is conducted after the outer periphery etching step. Further in Example 4, formation of the side grooves 11d proceeds simultaneously with outline shaping of the tuning-fork crystal wafer into a predetermined pattern. This shaping process is herein after described with reference to FIG. 8 and FIG. 9.

The steps in FIGS. 8(a)-(c) are identical to those in FIGS. 2(a)-(c) for Example 1 as above, and explanation of these steps is omitted here.

Afterwards, outline patterning is performed as illustrated in FIG. 8(d). The photoresist layers are partially removed in such a manner that the photoresist layers 4 remain on oscillator-shape areas A which correspond to the pattern of an intended tuning-fork crystal wafer, on frames C which define the outer border of the crystal substrate 2, and on some parts of formation portions for the grooves 11c, 12c.

As mentioned above, the photoresist layers 4 are partially retained in the formation portions for the grooves 11c, 12c in the following manner. Just as the groove side patterning illustrated in FIG. 7(a) for Example 3, the photoresist layers 4 are removed from the parts to be the grooves 11c, 12c, but only along both sides of the respective grooves 11c, 12c (namely, along the left and right lateral borders of the respective grooves 11c, 12c, as illustrated in FIG. 8(d)). Similar to the previous Examples, the removal width of the photoresist layers 5 is determined in advance according to the depth (the design depth) of the intended grooves 11c, 12c.

Moving next to FIG. 8(e), the metal layers 3 are etched away in a Au etchant and a Cr etchant, from the parts where the photoresist layers 4 were removed in FIG. 8(d). Thereby, the crystal substrate 2 is exposed at the parts where the metal layers 3 were etched away.

Turning then to FIG. 8(f), the photoresist layers 4 which were retained in FIG. 8(e) are removed completely.

Referring next to FIG. 9(a) which depicts the legs 11, 12 on an enlarged scale, outline etching is performed with use of a crystal etchant, whereby only the oscillator-shape areas A and the frames C are retained. During the outline etching, both sides of the respective grooves 11c, 12c are also etched to form side grooves 11d, 12d. At this stage, the portions subjected to the etching treatment are small in area (an area on the crystal substrate 2), so that the amount of etching in the crystal substrate 2 is regulated by an etch stop action. Namely, when the substrate is etched to a certain degree, a crystal surface appears on each etched surface. Such a substrate is not etched any further, no matter how long it is kept immersed in the crystal etchant. Specifically, in the case of the groove side patterning depicted in FIG. 8(d), the removal width of the photoresist layers 4 is set in advance according to the design width of the grooves 11c, 12c. This arrangement enables the side grooves 11d, 12d to have a desired depth on occurrence of an etch stop.

The steps in FIGS. 9(b)-(f) are identical to those in FIGS. 7(e)-(i) for Example 3 as above, and explanation of these steps is omitted here.

Similar to Example 3 above, this embodiment can improve precision in processing the grooves 11c, 12c in the crystal wafer. Consequently, it is possible to ensure a low CI effectively and to restrict variations of the oscillation frequency. Further, utilization of the etch stop technique can realize a high processing precision without etch time management, and can simplify control operations. In addition, this embodiment can conduct outline etching of the tuning-fork crystal wafer and etching of the side grooves 11d, 12d at the same time. Thus, in comparison with Example 3, it is possible to decrease the number of etching operations for the crystal substrate 2, thereby protecting the crystal wafer from surface roughening and other troubles. Furthermore, as in the case of Example 1 above, the central parts of the grooves 11c, 12c can be made as flat surfaces which are substantially parallel to the major surfaces 11a, 12a of the crystal wafer. Therefore, the left and right legs 11, 12 can acquire a generally symmetrical cross-section, and the excitation electrodes 13, 14 can be provided in a uniform thickness. Such a crystal transducer can exhibit favorable characteristics.

Example 5

Figure 10:
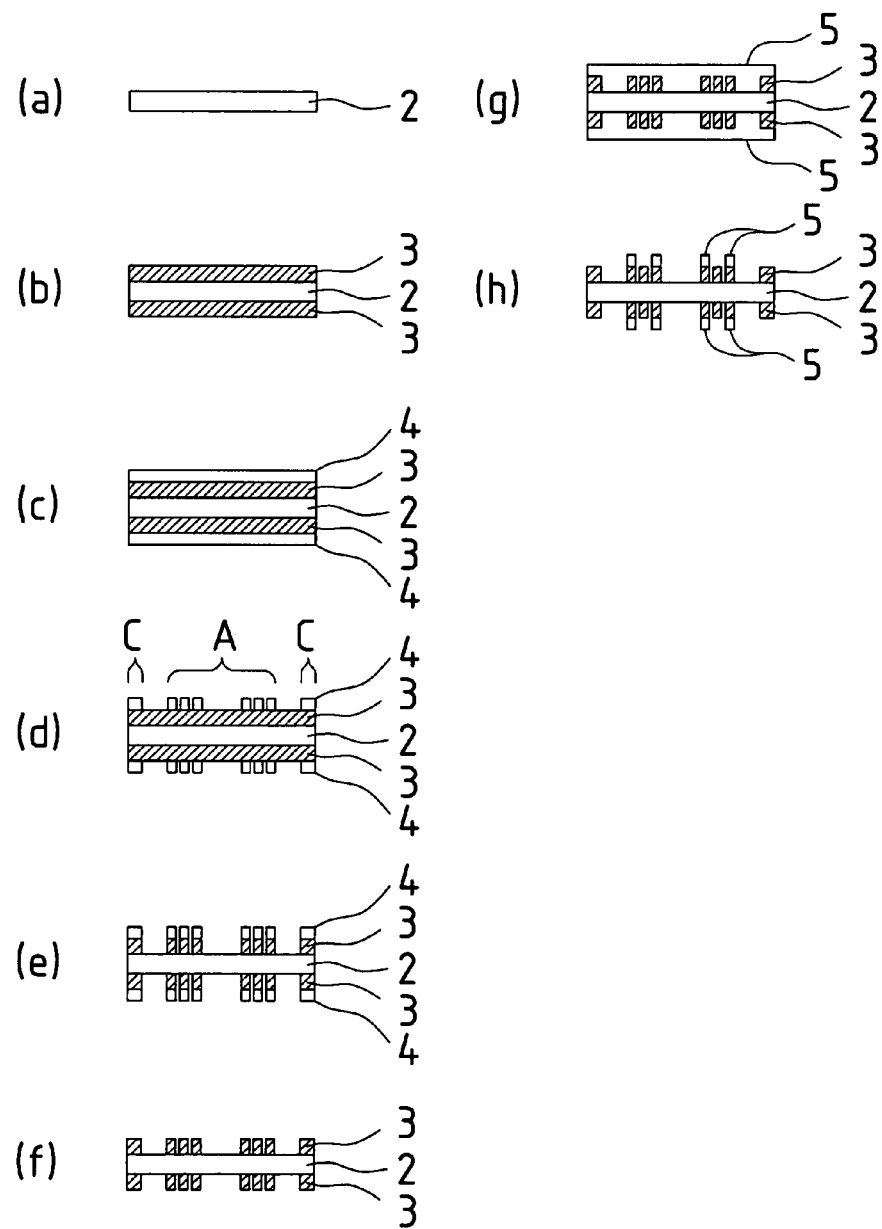
FIG. 10 shows a first half of a process for shaping a tuning-fork crystal wafer according to Example 5.

Now the description moves to Example 5. The shaping method of a tuning-fork crystal oscillator 1 according to this embodiment is similar to Example 4 above in that formation of the side grooves 11d, 12d proceeds simultaneously with outline shaping of the tuning-fork crystal wafer into a predetermined pattern. This shaping process is herein after described with reference to FIG. 10 and FIG. 11.

The steps in FIGS. 10(a)-(f) are identical to those in FIGS. 8(a)-(f) for Example 4 as above, and explanation of these steps is omitted here.

Later, as illustrated in FIG. 10(g), the crystal substrate 2 is entirely covered with photoresist layers 5. Since side grooves 11d, 12d are not formed in the crystal substrate 2 yet, the photoresist layers 5 can be formed entirely and uniformly over the crystal substrate 2 by spin coating. Hence, a high patterning precision can be expected.

Then, the photoresist layers 5 are partially removed as illustrated in FIG. 10(h). To be specific, the photoresist layers 5 are removed except at the parts which cover the metal layers 3 along both sides of the respective grooves 11c, 12c.

Referring next to FIG. 11(a) which depicts the legs 11, 12 on an enlarged scale, outline etching is performed with use of a crystal etchant, whereby only the oscillator-shape areas A and the frames C are retained. During the outline etching, both sides of the respective grooves 11c, 12c are also etched to form side grooves 11d, 12d. At this stage, the portions subjected to the etching treatment are small in area (an area on the crystal substrate 2), so that the amount of etching in the crystal substrate 2 is regulated by an etch stop action. Namely, when the substrate is etched to a certain degree, a crystal surface appears on each etched surface. Such a substrate is not etched any further, no matter how long it is kept immersed in the crystal etchant. Specifically, in the case of the groove side patterning depicted in FIG. 10(d), the removal width of the photoresist layers 4 is set in advance according to the design width of the grooves 11c, 12c. This arrangement enables the side grooves 11d, 12d to have a desired depth on occurrence of an etch stop.

The steps in FIGS. 11(b)-(d) are identical to those in FIGS. 7(g)-(i) for Example 3 as above, and explanation of these steps is omitted here.

Similar to the previous Examples, this embodiment can improve precision in processing the grooves 11c, 12c, thereby reducing the CI and restricting variations of the oscillation frequency. Further, utilization of the etch stop technique can simplify control operations. Moreover, as in the case of Example 4 above, it is possible to decrease the number of etching operations for the crystal substrate 2, thereby protecting the crystal wafer from surface roughening and other troubles. Furthermore, the central parts of the grooves 11c, 12c can be made as flat surfaces which are substantially parallel to the major surfaces 11a, 12a of the crystal wafer. Such a crystal transducer can exhibit favorable characteristics.

Example 6

Now the description moves to Example 6. Concerning the manner of forming the grooves 11c, 12c, the shaping method of a tuning-fork crystal oscillator 1 according to this embodiment initiates the center etching step after the start of, but before the completion of, the outer periphery etching step. To put it differently, at the start of the center etching step, it proceeds side by side with the outer periphery etching step. This shaping process is herein after described with reference to FIG. 12 and FIG. 13.

The steps in FIGS. 12(a)-(g) are identical to those in FIGS. 10(a)-(g) for Example 5 as above, and explanation of these steps is omitted here.

Afterwards, the photoresist layers 5 are partially removed as illustrated in FIG. 12(h). Specifically, as such patterning, the photoresist layers 5 are removed from the parts to be the grooves 11c, 12c, but only at the portions to be etched in the central etching step (such portions are herein after called "groove center portions"). Just as the previous Examples, the removal width of the photoresist layers 5 is determined in advance according to the depth (the design depth) of the intended grooves 11c, 12c.

Turning next to FIG. 12(i), in the metal layers 3 which are not covered with the photoresist layers 5 as shown in FIG. 12(h), only the Au layers are etched away in the Au etchant. Now, the parts corresponding to the groove center portions are covered with the Cr layers alone which serve as etch retardant layers in the context of this invention.

Figure 12:
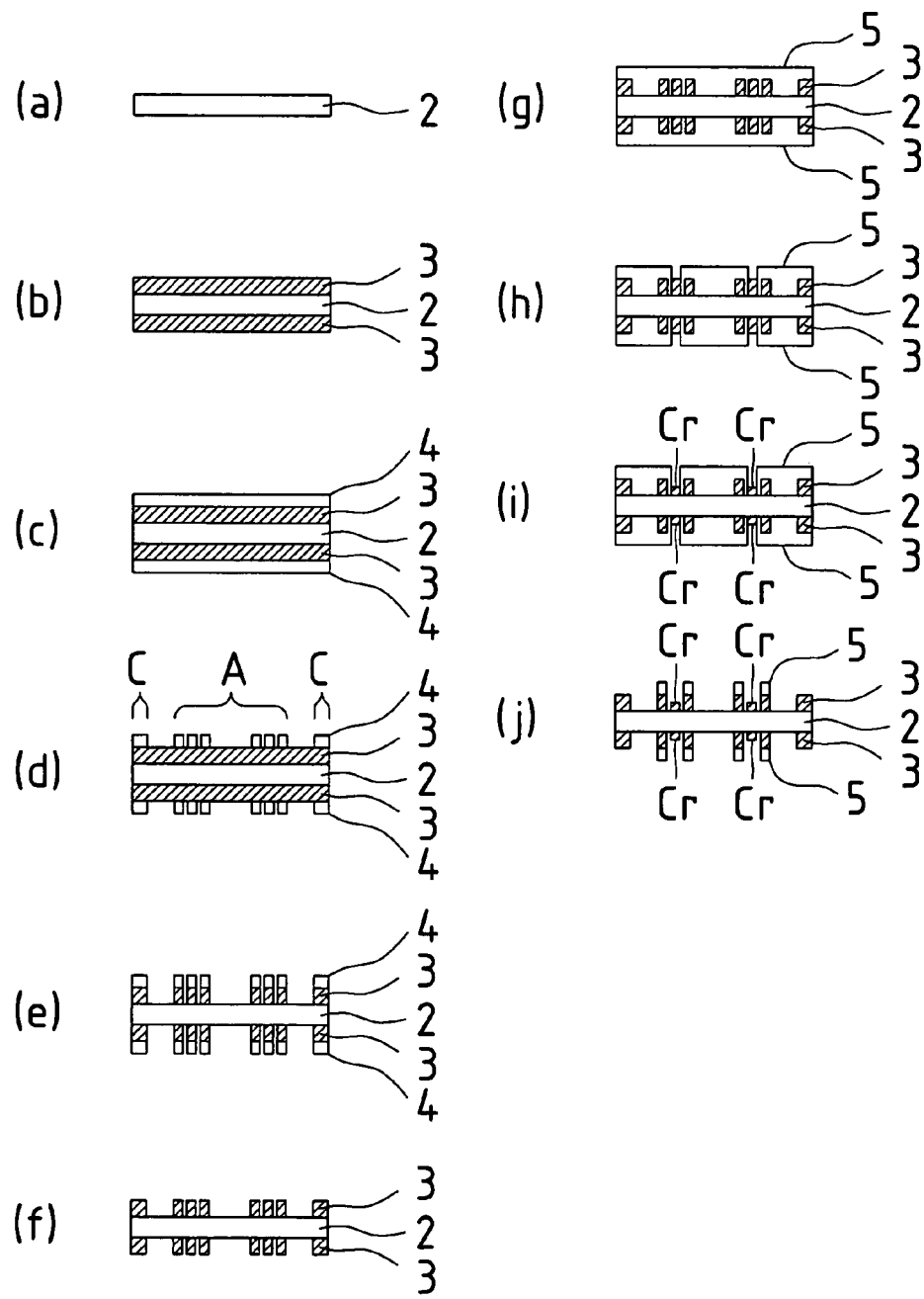
FIG. 12 shows a first half of a process for shaping a tuning-fork crystal wafer according to Example 6.

Then, the photoresist layers 5 are partially removed as illustrated in FIG. 12(*j*). To be specific, the photoresist layers 5 are removed except at the parts which cover the metal layers 3 along both sides of the respective grooves 11*c*, 12*c*.

Figure 13:
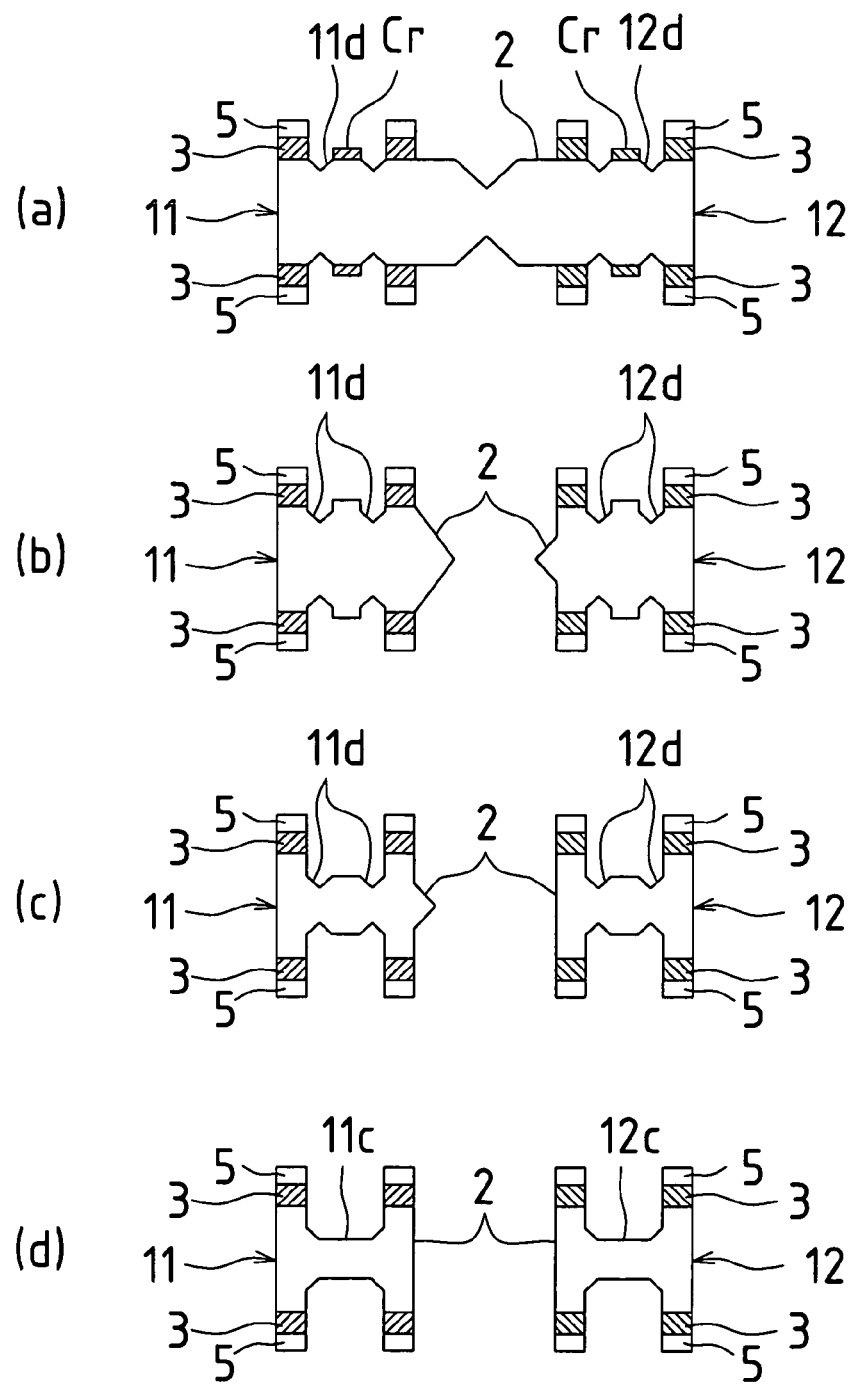
FIG. 13 shows a second half of a process for shaping a tuning-fork crystal wafer according to Example 6.

Referring next to FIG. 13(*a*) which depicts the legs 11, 12 on an enlarged scale, outline etching is performed with use of a crystal etchant, whereby only the oscillator-shape areas A and the frames C are retained. During the outline etching, both sides of the respective grooves 11*c*, 12*c* are also etched to start formation of side grooves 11*d*, 12*d*. At this stage, since the metal layers 3 which cover the parts corresponding to the groove center portions are composed of the Cr layers alone, such Cr layers are also etched (dissolved and removed) in the crystal etchant. FIG. 13(*b*) shows the outline etching step in progress, with the Cr layers which cover the parts corresponding to the groove center portions being removed completely. However, the outline etching step and the etching step for the side grooves 11*d*, 12*d* (the outer periphery etching step) are not yet finished.

When the etching in the crystal etchant advances beyond this state, etching of the crystal substrate 2 finally starts at the parts corresponding to the groove center portions where the Cr layers were etched away completely, as shown in FIG. 13(*c*). At this moment, the crystal wafer outline etching step, the outer periphery etching step, and the center etching step proceed side by side.

After these etching steps continue for a certain period of time, the crystal substrate 2 is transformed into a predetermined tuning-fork shape. As for the formation of the grooves 11*c*, 12*c*, the outer periphery etching step finishes due to an etch stop action, with the side grooves 11*d*, 12*d* being formed first. Later, when etching in the center etching step reaches the depth of the side grooves 11*d*, 12*d*, the etching ceases any further progress. Eventually, the grooves 11*c*, 12*c* of a predetermined depth are obtained (see FIG. 13(*d*)).

Similar to the previous Examples, this embodiment can improve precision in processing the grooves 11*c*, 12*c*, thereby reducing the CI and restricting variations of the oscillation frequency. Further, utilization of the etch stop technique can simplify control operations. Moreover, because the crystal wafer outline etching step, the outer periphery etching step and the center etching step are carried out simultaneously, the crystal substrate 2 undergoes not more than one etching operation. Hence, the crystal wafer can be surely protected from surface roughening and other troubles. It is also possible to avoid complex processing operations and to shorten the process time. Furthermore, the central parts of the grooves 11*c*, 12*c* can be made as flat surfaces which are substantially parallel to the major surfaces 11*a*, 12*a* of the crystal wafer. Such a crystal transducer can exhibit favorable characteristics.

Incidentally, Example 6 and Example 2 as above are arranged to prepare the portions which are covered with the Cr layers 31 alone and those doubly covered with the Cr layers 31 and the Au layers 32, and to delay the start of an etching operation only in the portions covered with the Cr layers 31 alone. However, this should not be construed as a limitation. Alternatively, some portions may be covered with Cr layers and other portions may be covered with Cr oxide layers, in which case the start of an etching operation is delayed only in the portions covered with the Cr (unoxidized) layers. Cr layers can be partially oxidized by eximer UV radiation, UV-03 dry cleaning, O2 plasma treatment, to name a few.

Example 7

Now the description moves to Example 7. In the previous Examples, the center etching step is conducted to turn the bottoms of the grooves 11*c*, 12*c* into flat surfaces which are substantially parallel to the major surfaces 11*a*, 12*a*. On the contrary, this embodiment is arranged to retain projections at the bottoms of the grooves 11*c*, 12*c*, at the end of the center etching step. In other words, the center etching step terminates before projections at the bottoms of the grooves 11*c*, 12*c* are completely etched away and the bottoms become flat surfaces. This central etching step is applicable to any of Examples 3 to 6 mentioned earlier.

Figure 14:
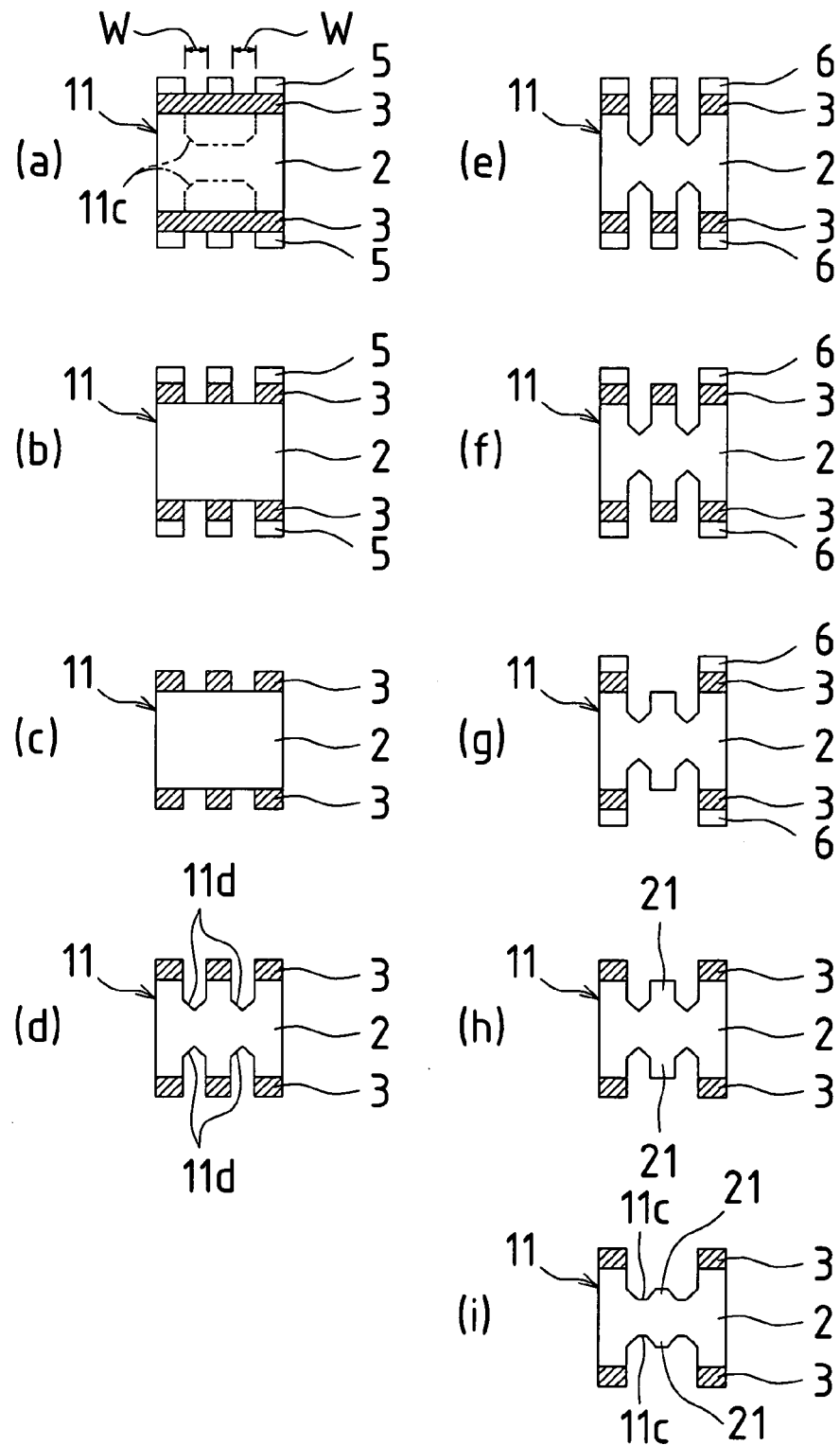
FIG. 14, which corresponds to FIG. 7, shows a second half of a process for shaping a tuning-fork crystal wafer according to Example 7.

Taking Example 3 as an example, the process for retaining projections at the bottoms of the grooves 11*c*, 12*c* is described with reference to FIG. 14. FIG. 14 corresponds to the second shaping process (FIG. 7) in Example 3 above. In this situation, it should be understood that the first shaping process illustrated in FIG. 6 has been finished as the preparatory steps for the steps shown in FIG. 14.

The steps in FIGS. 14(*a*)-(*g*) are identical to those in FIG. 7(*a*)-(*g*) for Example 3 as above, and explanation of these steps is omitted here.

After the photoresist layers 6 are removed as shown in FIG. 14(*h*), the crystal substrate 2 is etched in the crystal etchant. Thereby, etching of the crystal substrate 2 is initiated at the parts (projections 21) which stand between pairs of side grooves 11*d*, 11*d*. This etching operation is terminated in a relatively short time (shorter than in Example 3 above), so that the projections 21 are retained at the bottoms of the grooves 11*c* as illustrated in FIG. 14(*i*).

Thus, the center etching step is terminated, with the bottoms of the grooves 11*c* retaining the projections 21. This arrangement can enlarge the surface areas within the grooves 11*c*, increasing the areas of the excitation electrodes 13 provided within the grooves 11*c* and ensuring a low CI effectively.

As for the CI restriction effect, experiments have confirmed that manifestation of the effect depends on the cross-sectional thickness of the thinnest part between the grooves 11*c*. With respect to the crystal wafer shaped in this Example, the thinnest cross-sectional part between the grooves 11*c* is made as thin as possible, with the central parts of the grooves 11*c* retaining the projections 21. As a result, it is possible to secure a satisfactory rigidity for a crystal wafer as well as to ensure a sufficiently low CI.

Figure 9:
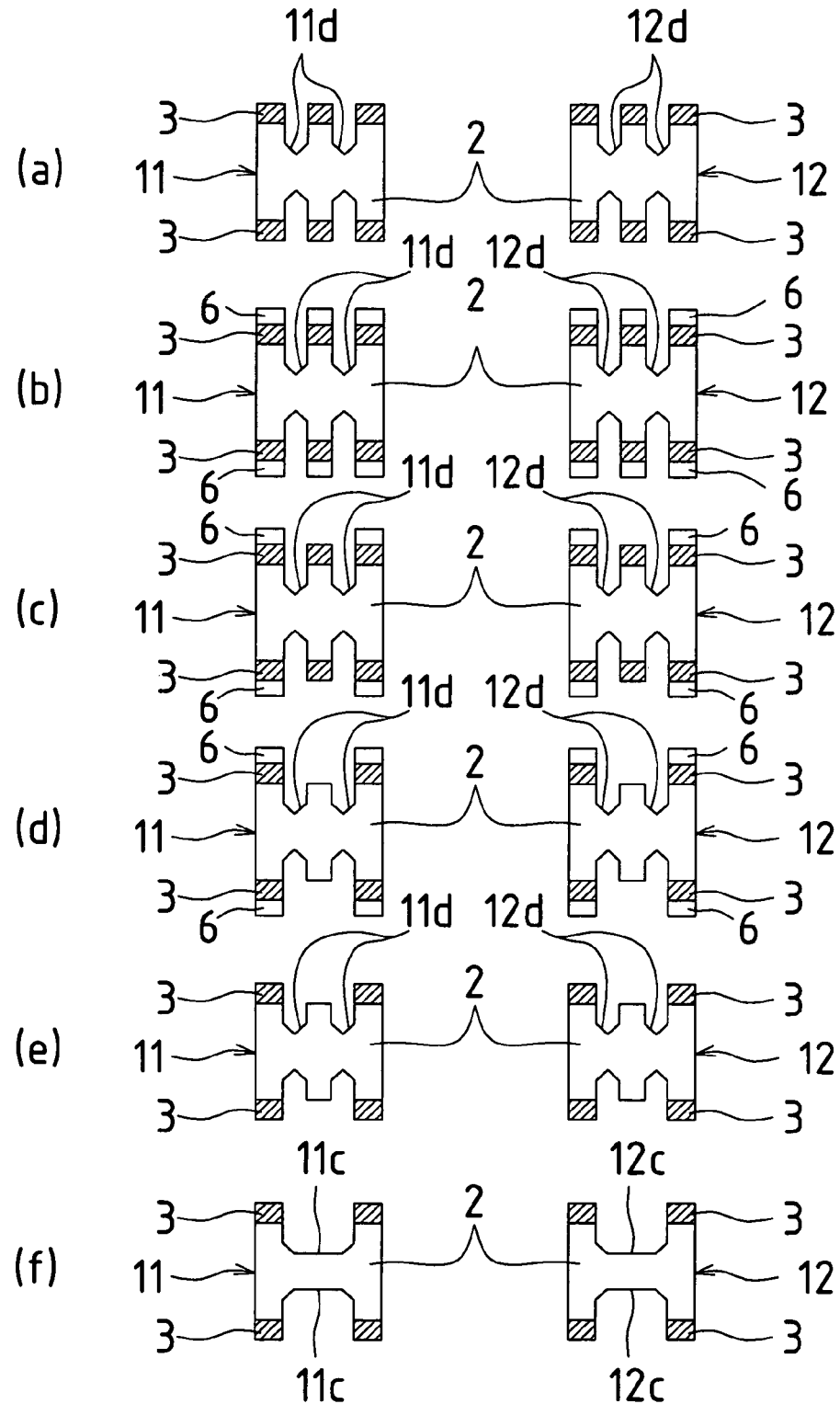
FIG. 9 shows a second half of a process for shaping a tuning-fork crystal wafer according to Example 4.
Figure 11:
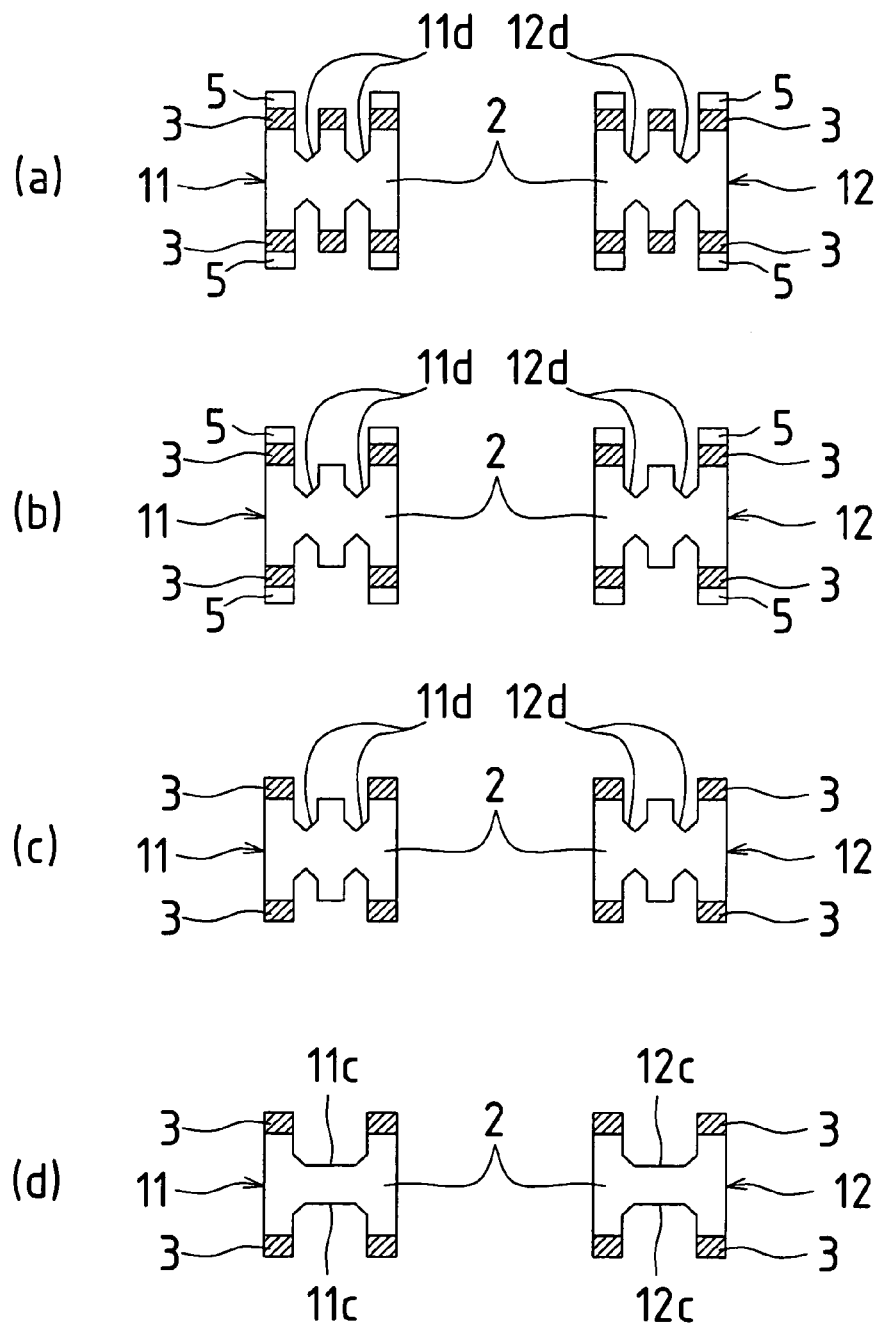
FIG. 11 shows a second half of a process for shaping a tuning-fork crystal wafer according to Example 5.
Figure 15:
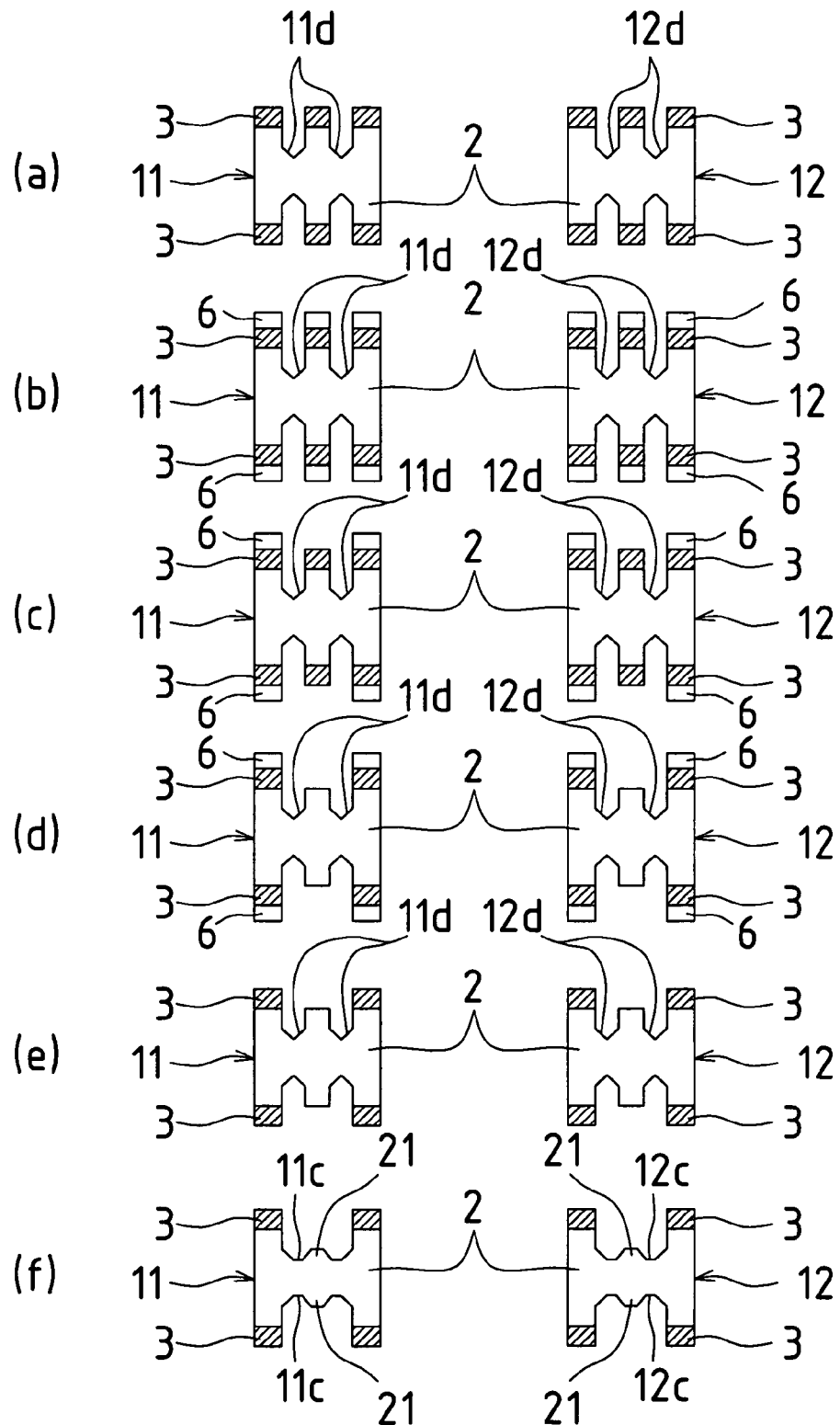
FIG. 15, which corresponds to FIG. 9, shows a second half of a process for shaping a tuning-fork crystal wafer according to Example 7.
Figure 16:
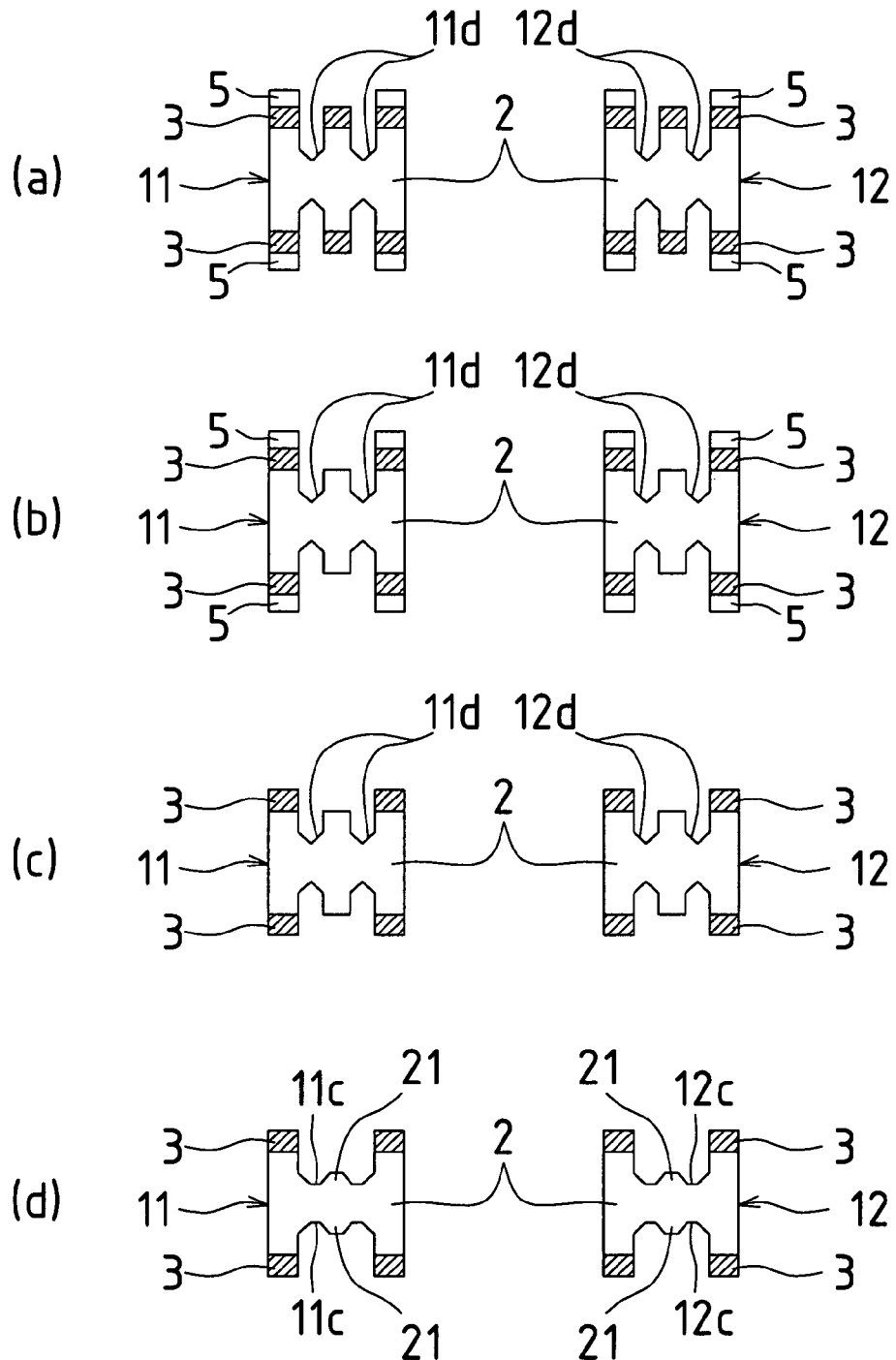
FIG. 16, which corresponds to FIG. 11, shows a second half of a process for shaping a tuning-fork crystal wafer according to Example 7.
Figure 17:
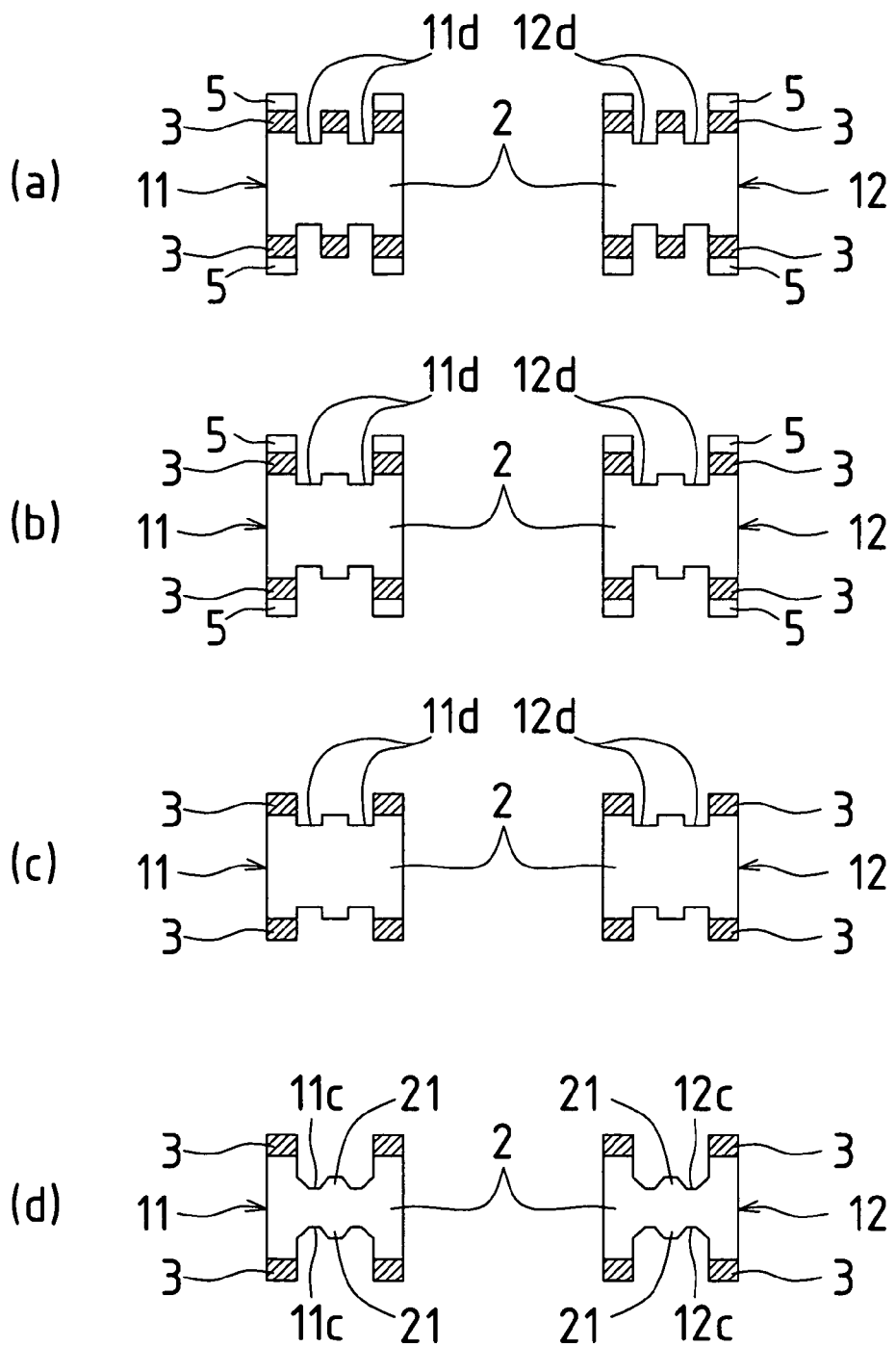
FIG. 17, which corresponds to FIG. 13, shows a second half of a process for shaping a tuning-fork crystal wafer according to Example 7.

FIG. 15, corresponding to FIG. 9, shows how to retain projections 21 at the bottoms of the grooves 11*c*, 12*c* in Example 4. FIG. 16, corresponding to FIG. 11, shows how to retain projections 21 at the bottoms of the grooves 11*c*, 12*c* in Example 5. FIG. 17, corresponding to FIG. 13, shows how to retain projections 21 at the bottoms of the grooves 11*c*, 12*c* in Example 6.

Regarding any of these cases, the crystal substrate 2 is etched at the parts (projections 21) which stand between the pairs of side grooves 11*d*, 11*d*. This etching operation is terminated in a relatively short time, so that the projections 21 are retained at the bottoms of the grooves 11*c*, 12*c*. This arrangement can enlarge the surface areas within the grooves 11*c*, increasing the areas of the excitation electrodes 13 provided within the grooves 11*c* and ensuring a low CI effectively.

Example 8

Now the description moves to Example 8. In the tuning-fork crystal oscillator 1 according to the previous Examples, each major surface of the legs 11, 12 contains one groove 11c, 12c, respectively. In contrast, this Example is arranged to set a plurality of etch portions (small-area etch portions) in each of the legs 11, 12 and to design an etch process range with a group of small-area etch portions.

Figure 19:
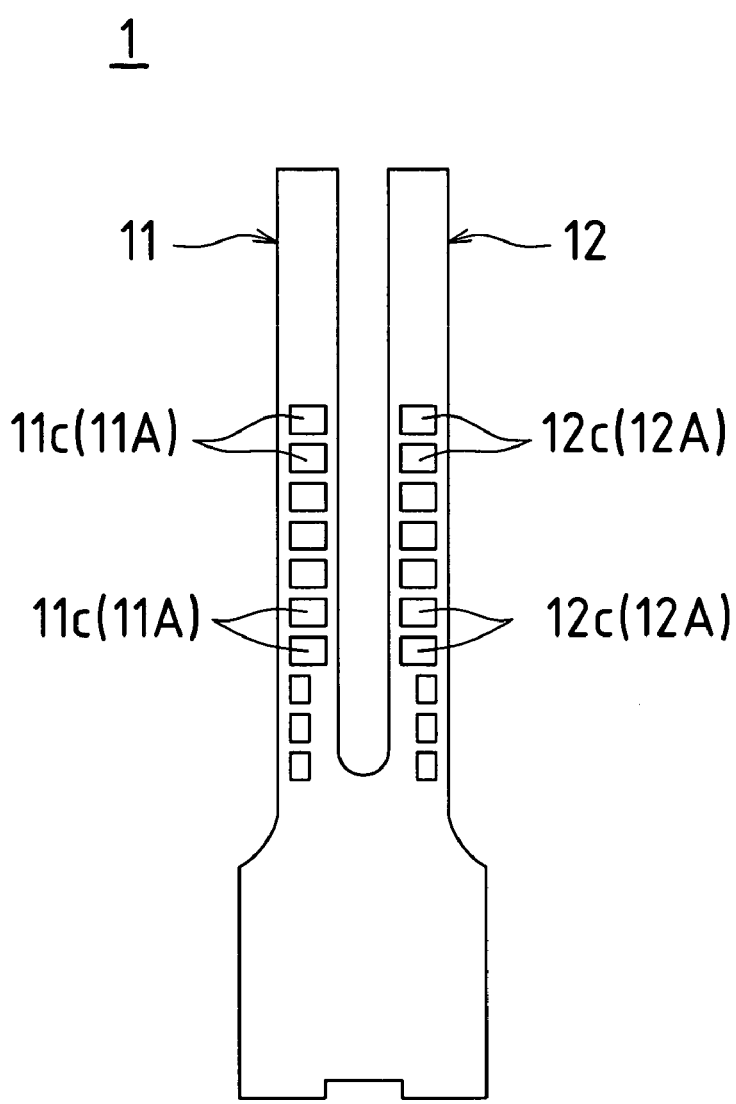
FIG. 19 shows a tuning-fork crystal oscillator of the first type according to Example 8.
Figure 20:
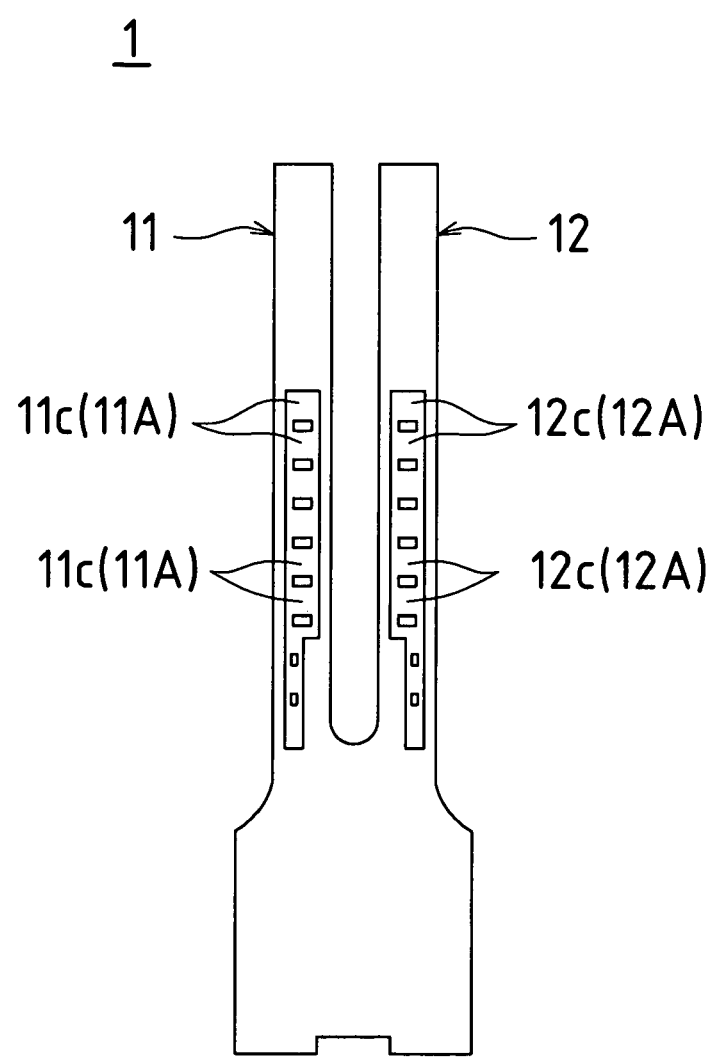
FIG. 20 shows a tuning-fork crystal oscillator of the second type according to Example 8.

FIG. 19 represents a tuning-fork crystal oscillator 1 of the first type according to this Example, to be equipped in a tuning-fork crystal transducer. FIG. 20 represents a tuning-fork crystal oscillator 1 of the second type according to this Example, to be equipped in a tuning-fork crystal transducer.

Referring first to FIG. 19, each major surface of the legs 11, 12 contains ten small-area etch portions 11A, 11A, ..., 12A, 12A, ... which are separate from each other. By an etching treatment as effected in the previous Examples, grooves 11c, 11c, ..., 12c, 12c, ... are formed in these small-area etch portions 11A, 11A, ..., 12A, 12A, ....

In each of these legs 11, 12, the formation portions for the grooves 11c, 11c, ..., 12c, 12c, ... have a relatively large area in total. On the other hand, the individual grooves 11c, 11c, ..., 12c, 12c, ... have small areas at the bottoms. Therefore, a given amount of etching treatment can be effected by means of the etch stop technique.

As mentioned above, each of the etched surfaces obtained by the etch stop technique reveals a crystal surface. Because pits (mentioned above) do not appear on this crystal surface, exposure of pits can be avoided on the etched surfaces throughout the etch portions. Hence, the grooves 11c, 12c of pre-determined patterns can be provided in the legs 11, 12 of the tuning-fork crystal oscillator 1, respectively. In this arrangement, etch portions in the legs 11, 12 of the tuning-fork crystal oscillator 1 are set by groups of a plurality of small-area etch portions 11A, 11A, ..., 12A, 12A, .... Thereby, it is possible to define etch process ranges in a relatively large area, while reducing exposure of pits. Particularly when this arrangement is applied to a relatively large tuning-fork crystal oscillator 1 which can achieve a low impedance, the number of exposed pits can be significantly decreased in its etch process ranges. Hence, the oscillation frequency of a tuning-fork crystal transducer can be tuned to a target frequency.

The design illustrated in FIG. 19 is composed of two types of small-area etch portions 11A, 12A which are different in area. To form the grooves 11c, 12c, all of those small-area etch portions 11A, 12A may be subjected to a single etching treatment (similar to the etching treatment in Examples 1 and 2 above). Alternatively, to form the grooves 11c, 12c, larger ones of the small-area etch portions 11A, 12A may be subjected to the outer periphery etching step and the center etching step mentioned above (similar to the etching treatment in Examples 3 to 7 above). Incidentally, the small-area etch portions 11A, 12A are smaller at the basal end of the legs 11, 12 than the others. This arrangement is intended to secure a greater dimension for extraction of side electrodes and extraction electrodes (not shown) to the major surfaces, thereby avoiding short circuiting between electrodes.

In FIG. 20, the small-area etch portions 11A, 11A, ..., 12A, 12A, ... as mentioned in FIG. 19 are partially integrated with each other. Also in this case, it is possible to define etch process ranges in a relatively large area, while reducing exposure of pits. Particularly when this arrangement is applied to a large tuning-fork crystal oscillator 1, the number of exposed pits can be significantly decreased in its etch process ranges. Hence, the oscillation frequency of a tuning-fork crystal transducer can be tuned to a target frequency.

With respect to the small-area etch portions 11A, 11A, ..., 12A, 12A, ... which have the shapes shown in FIG. 20, the following etching treatments are applicable. To form the grooves 11c, 12c, all of those small-area etch portions 11A, 12A may be subjected to a single etching treatment (similar to the etching treatment in Examples 1 and 2 above). Alternatively, to form the grooves 11c, 12c, larger ones of the small-area etch portions 11A, 12A may be subjected to the outer periphery etching step and the center etching step mentioned above (similar to the etching treatment in Examples 3 to 7 above).

Other Examples

In all of the Examples detailed above, the invention is applied to an etching method for shaping a tuning-fork crystal wafer. However, this should not be construed as a limitation. The invention is further applicable to shaping of other crystal wafers (e.g., an AT-cut crystal wafer).

As a manner of transforming the crystal substrate 2 into a predetermined tuning-fork shape, all of the Examples adopt wet etching. However, this should not be construed as a limitation. The invention is further applicable when dry etching is adopted in order to transform the crystal substrate 2 into a predetermined tuning-fork shape.

In yet another regard, this invention is applicable to not only production of piezoelectric oscillators using crystal wafers, but also production of those using lithium niobate, lithium tantalate or the like, and production of other various electronic components. Further, the material to be shaped should not be limited to piezoelectric materials, and a variety of materials such as glass, metals, and semiconductor materials can be adopted as such.

As described above, Examples 3 to 7 involve the outer periphery etching step. With respect to the grooves 11c, 12c each of which has a rectangular opening defined by sides, the etching treatment in these Examples is effected only along a pair of opposing sides in each opening and their vicinities. However, this should not be construed as a limitation. In each rectangular opening defined by sides, the etching treatment may be effected along only one side in the opening and its vicinity, or along three sides in the opening and their vicinities.

Figure 21:
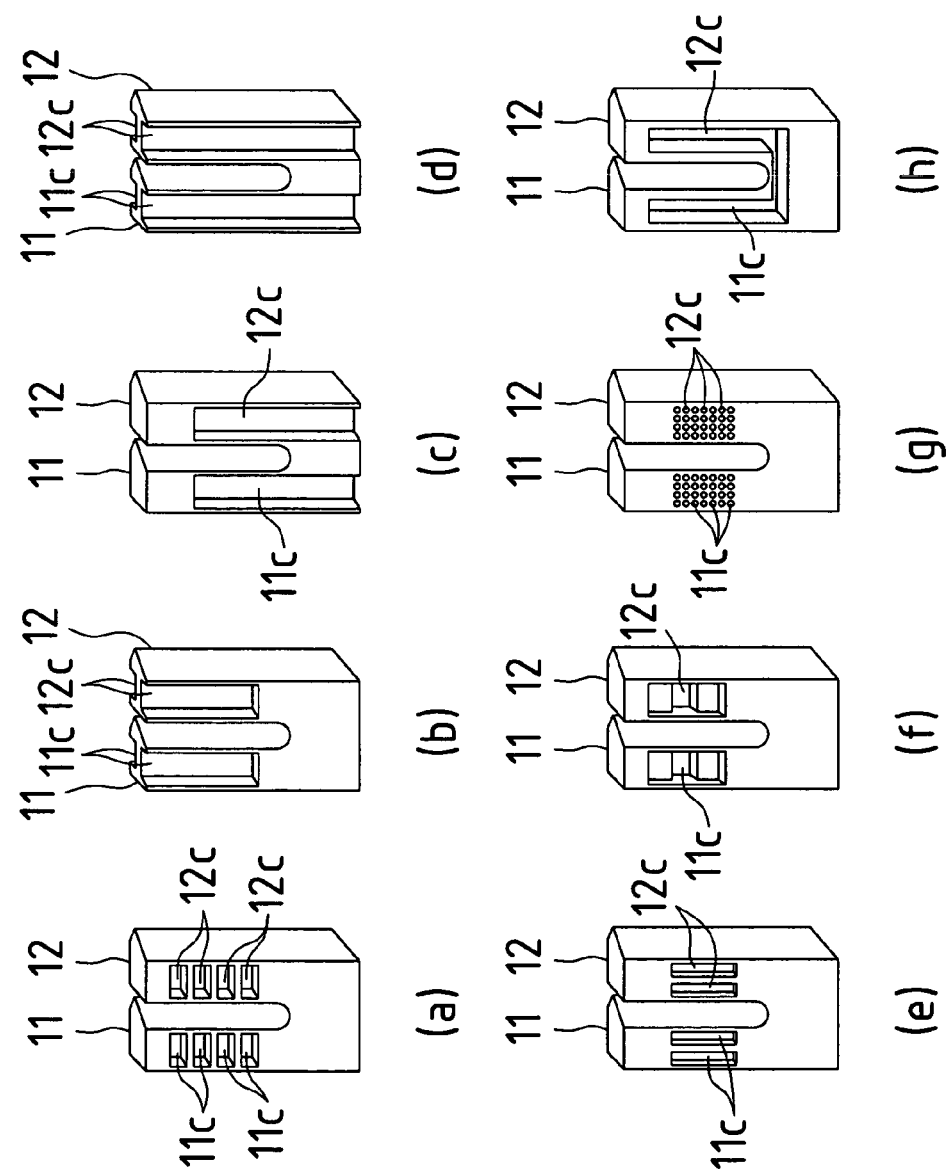
FIG. 21 shows, in perspective, crystal wafers which adopt various arrangements for increasing the surface areas of legs.
Figure 22:
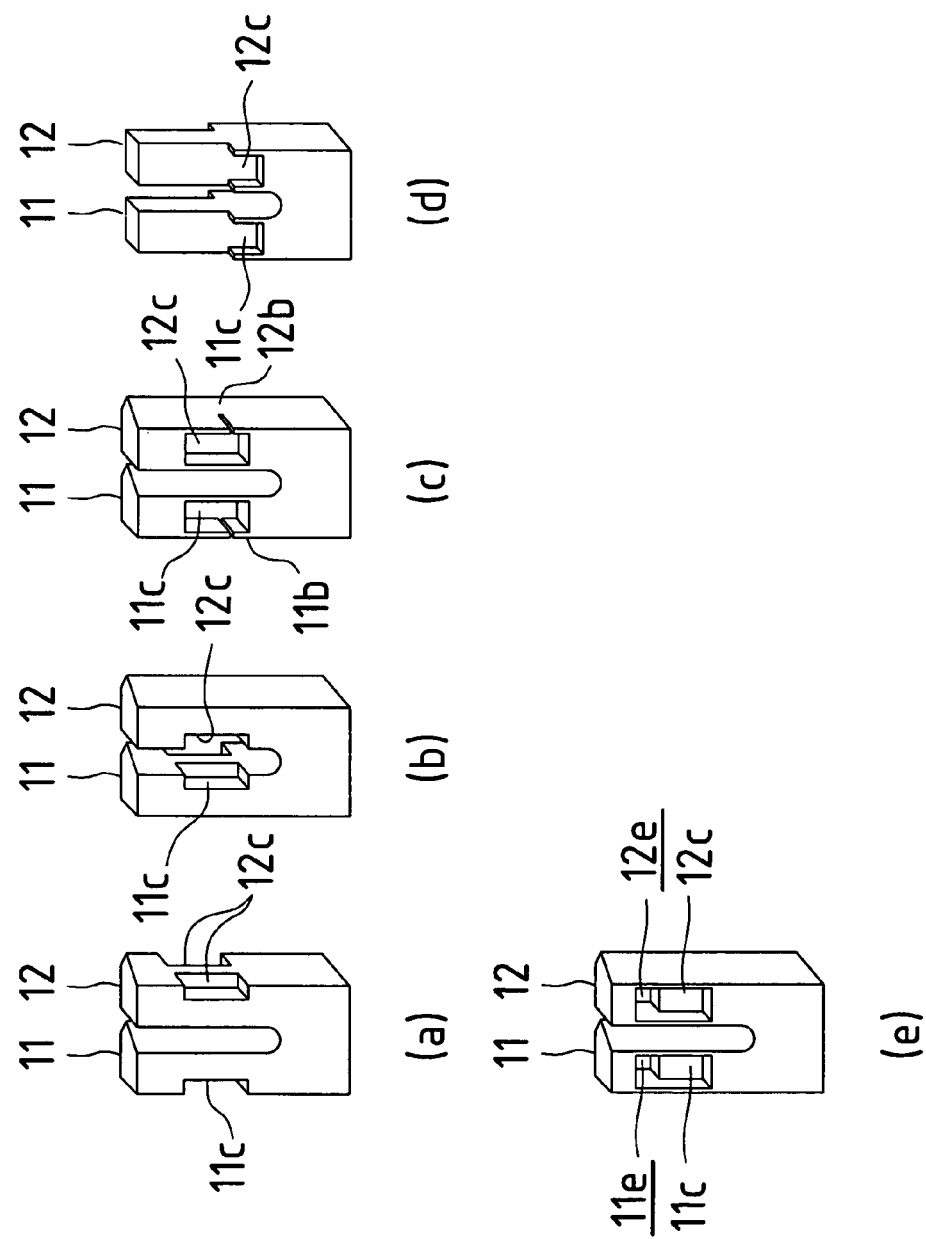
FIG. 22 shows, in perspective, crystal wafers which adopt other various arrangements for increasing the surface areas of legs.
Figure 23:
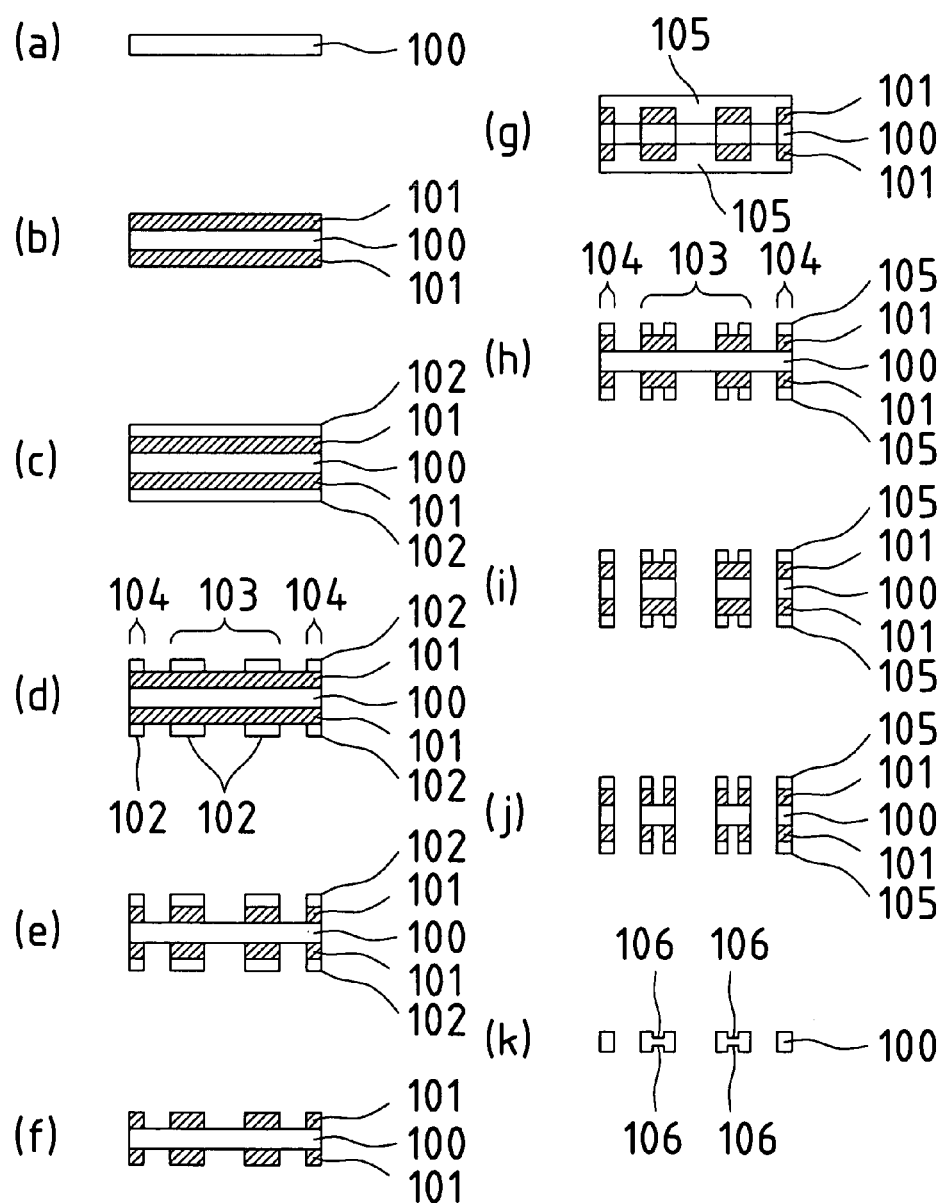
FIG. 23 shows a conventional process for shaping a tuning-fork crystal wafer.
Figure 24:
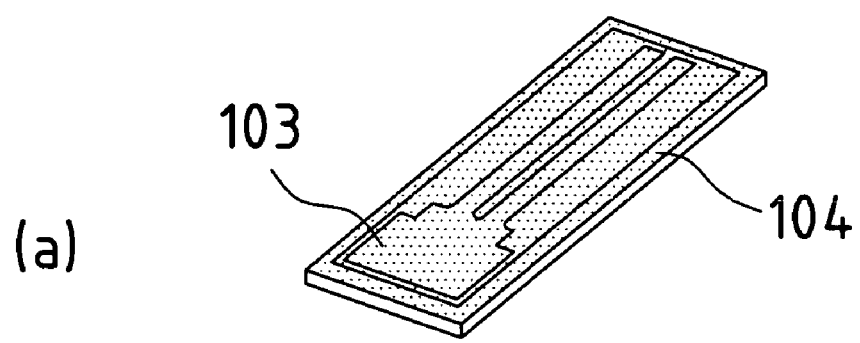
FIG. 24 shows, in perspective, crystal substrates during the conventional process for shaping a tuning-fork crystal wafer.
Figure 24:
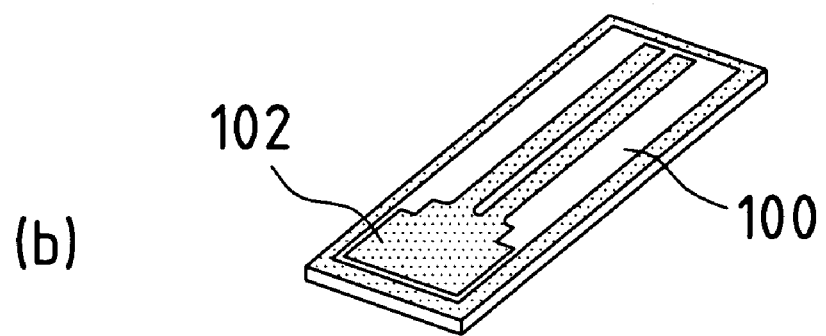

Furthermore, as mentioned earlier, if the excitation electrodes 13 within the grooves 11c have greater areas, it is possible to ensure a low CI effectively. Bearing this in mind, it is preferable to enlarge the surface areas of the legs 11, 12 so as to increase the areas of the excitation electrodes 13. FIG. 21 and FIG. 22 illustrate various arrangements for enlarging the surface areas of the legs 11, 12. Crystal wafers of such shapes can be made by the etching methods according to this invention, and can therefore ensure a low CI effectively.

Now, the shapes of crystal wafers depicted in FIG. 21 and FIG. 22 are described in brief. FIG. 21 is concerned with recesses (grooves) formed in a major surface of a crystal wafer. To be specific, FIG. 21(a) shows a plurality of rectangular grooves 11c, 11c, ..., 12c, 12c, ... which are arranged lengthwise in the legs 11, 12, the groove pattern being substantially the same as the one in Example 8 as above. FIG. 21(b) shows grooves 11c, 12c which are open at the extreme ends of the legs 11, 12. FIG. 21(c) shows grooves 11c, 12c which are open at the basal end of the crystal wafer. FIG. 21(d) shows grooves 11c, 12c which extend from the extreme end to the basal end of the crystal wafer and are open at both ends. FIG. 21(e) shows pairs of rectangular grooves 11c, 11c, 12c, 12c which are arranged widthwise in the legs 11, 12. FIG. 21(f) shows grooves 11c, 12c which locate in the central parts of the legs 11, 12, with the bottom of each groove having a plurality of stepped portions. FIG. 21(g) shows a plurality of circular recesses 11c, 11c, ..., 12c, 12c, ... which are formed in the legs 11, 12. FIG. 21(h) shows an integral recess which is made by connecting grooves 11c, 12c in the legs 11, 12. Among them, those of FIGS. 21(a) (e) and (g) are worth particular attention. In these cases, since each of the etched surfaces obtained by the etch stop technique reveals a crystal surface, exposure of pits can be avoided on the etched surfaces throughout the etch portions. Hence, the oscillation frequency of a tuning-fork crystal transducer can be easily tuned to a target frequency.

In addition, FIG. 22(a) shows grooves 11c, 12c which locate at the outer corners of the legs 11, 12. FIG. 22(b) shows grooves 11c, 12c which locate at the inner corners of the legs 11, 12. FIG. 22(c) shows grooves 11c, 12c which locate in the central parts of the legs 11, 12, with part of the grooves 11c, 12c being open to the side surfaces 11b, 12b. In FIG. 22(d), the central parts and extreme ends of the legs 11, 12 are coplanar with the bottoms of grooves 11c, 12c. FIG. 22(e) shows grooves 11c, 12c which also serve as through-holes 11e, 12e penetrating the front and back surfaces of the legs 11, 12.

INDUSTRIAL APPLICABILITY

The etching methods according to this invention can be utilized to form grooves in the front and back surfaces of each leg of a tuning-fork crystal oscillator, with a view to ensuring a low CI for a tuning-fork crystal transducer.

The invention claimed is:

1. An etching method for etching away a prescribed etch portion of a material to be shaped to form an etch product, via an etching treatment in which an outline of the etch product is formed by etching a portion of the prescribed etch portion, and via an etching treatment in which a portion of a groove formation portion of the prescribed etch portion of the material to be shaped is etched away so as to form a depressed groove in the material to be shaped, said etching method for shaping an etch product comprising:

applying an etch retardant layer which only covers a surface of the groove formation portion of the prescribed etch portion of the material to be shaped so as to define an outer periphery of the etch product;

outline etching in the presence of the etch retardant layer, to remove a portion of the prescribed etch portion of the material to be shaped that is outside the outer periphery of the etch product so as to form the outline of the etch product;

dissolving at least a portion of the etch retardant layer which covers the groove formation portion, after starting and simultaneously with said outline etching; and groove etching to remove a portion of the groove formation portion of the prescribed etch portion of the material to be shaped which is no longer covered by the etch retardant layer so as to form the depressed groove in the groove formation portion to obtain the etch product, said groove etching being stopped at an etch stop position according to a pattern of the depressed groove, wherein the portion of the prescribed etch portion to be removed during said outline etching and the portion of the groove formation portion to be removed during said groove etching are separate portions of the material to be shaped such that the portion of the groove formation portion to be removed during said groove etching includes at least an outermost surface of the material to be shaped, and wherein a pattern of the etch retardant layer is set in advance such that an amount of said groove etching performed before said groove etching is stopped is substantially equal to a depressed groove depth which is also set in advance.

2. The etching method according to claim 1, further comprising:

applying a coating layer on at least a portion of the material to be shaped located within the outer periphery of the etch product by laminating components of different etch rates, in which a component of an upper layer has a lower etch rate than a component of a lower layer;

removing only the upper layer which covers the groove formation portion, thereby exposing the lower layer, and etching the material to be shaped, while utilizing the exposed lower layer as the etch retardant layer.

3. The etching method according to claim 1, wherein the etch product is a tuning-fork crystal wafer, and the depressed groove is formed in a central part of each major surface thereof.

4. The etching method according to claim 1 further comprising:

setting an etch process range on a surface of the material to be shaped; and dividing an inside of the etch process range into a plurality of adjacent etch portions.

5. The etching method according to claim 4, wherein the respective adjacent etch portions are arranged to define locations of separate grooves in the surface of the material to be shaped.

6. The etching method according to claim 4, wherein the respective adjacent etch portions are arranged to define a location of at least one continuous groove in the surface of the material to be shaped.

* * * * *

UNITED STATES PATENT AND TRADEMARK OFFICE
CERTIFICATE OF CORRECTION

PATENT NO. : 7,560,040 B2  Page 1 of 1
APPLICATION NO. : 10/490367
DATED : July 14, 2009
INVENTOR(S) : Syunsuke Satoh et al.

It is certified that error appears in the above-identified patent and that said Letters Patent is hereby corrected as shown below:

<u>On the title page:</u>

In item (75) replace "Shunsuke SATO" with -- Syunsuke SATOH --.

Signed and Sealed this

Thirteenth Day of October, 2009

David J. Kappos
*Director of the United States Patent and Trademark Office*